United States Patent
Tsai et al.

(10) Patent No.: US 11,435,396 B2
(45) Date of Patent: Sep. 6, 2022

(54) CHIP TESTING SYSTEM

(71) Applicant: ONE TEST SYSTEMS, Santa Clara, CA (US)

(72) Inventors: Chen-Lung Tsai, Saratoga, CA (US); Gene Rosenthal, Santa Cruz, CA (US)

(73) Assignee: ONE TEST SYSTEMS, Santa Clara, CA (US)

( * ) Notice: Subject to any disclaimer, the term of this patent is extended or adjusted under 35 U.S.C. 154(b) by 10 days.

(21) Appl. No.: 17/201,182

(22) Filed: Mar. 15, 2021

(65) Prior Publication Data

US 2022/0128621 A1 Apr. 28, 2022

(30) Foreign Application Priority Data

Oct. 23, 2020 (TW) .................................. 109136804

(51) Int. Cl.
*G01R 31/28* (2006.01)
*G01R 1/04* (2006.01)
*G01R 31/26* (2020.01)

(52) U.S. Cl.
CPC ....... *G01R 31/2856* (2013.01); *G01R 1/0408* (2013.01); *G01R 31/2612* (2013.01)

(58) Field of Classification Search
CPC ... G01R 31/2612; G01R 1/0408; H01L 22/14; H01L 22/34; H01L 22/32
USPC ............. 324/500, 600, 76.11, 762.01–762.6, 324/750–15, 754; 438/14–18; 257/E21.521–E21.524, 620; 361/302, 361/303, 321.2
See application file for complete search history.

(56) References Cited

U.S. PATENT DOCUMENTS

| | | | |
|---|---|---|---|
| 2004/0077200 A1* | 4/2004 | Ishikawa | G01R 31/01 439/190 |
| 2021/0132142 A1* | 5/2021 | Tsai | G01R 31/2874 |

* cited by examiner

*Primary Examiner* — Patrick Assouad
*Assistant Examiner* — Trung Q Nguyen
(74) *Attorney, Agent, or Firm* — Li & Cai Intellectual Property (USA) Office

(57) ABSTRACT

A chip testing system including a tray kit, an insertion member mounting apparatus, a testing apparatus, an insertion member detaching apparatus, and a conveying apparatus are provided. The chip tray kit includes a tray, a plurality of chip fixing members, and a plurality of auxiliary insertion members. The chip fixing members are fixed to the tray and are configured to carry a plurality of chips. The insertion member mounting apparatus can fix the auxiliary insertion members to a side of the chip fixing members, and the auxiliary insertion members can limit a movement range of the chips in the chip fixing members. The insertion member detaching apparatus can detach the auxiliary insertion members. When the chips are tested, a pressing assembly connected to a temperature adjusting device and reaching a predetermined temperature correspondingly presses a surface of each of the chips.

18 Claims, 21 Drawing Sheets

CHIP TESTING SYSTEM

CROSS-REFERENCE TO RELATED PATENT APPLICATION

This application claims the benefit of priority to Taiwan Patent Application No. 109136804, filed on Oct. 23, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip testing system, and more particularly to a chip testing system applicable to perform high frequency tests to a plurality of chips.

BACKGROUND OF THE DISCLOSURE

In an IC chip mounting process of a conventional IC chip testing apparatus (particularly a testing apparatus for performing high frequency tests to a plurality of IC chips), part of the IC chips may not be properly and electrically connected to a plurality of related probes of the conventional IC chip testing apparatus for various reasons. Accordingly, the IC chips that are not properly mounted to the related probes of the conventional IC chip testing apparatus cannot be correctly tested.

In the conventional IC chip testing apparatus, after the IC chips are mounted onto the conventional IC chip testing apparatus, the IC chips are generally not checked to confirm whether they are properly mounted. Therefore, a technical personnel will usually find that part of the IC chips are not properly mounted or tested only after the testing of all of the IC chips have been completed.

SUMMARY OF THE DISCLOSURE

In response to the above-referenced technical inadequacies, the present disclosure provides a chip testing system to improve the issues associated with a conventional IC chip testing apparatus. That is, part of a plurality of IC chips may not be correctly mounted onto the conventional IC chip testing apparatus, so that the IC chips are not correctly tested.

In one aspect, the present disclosure provides a chip testing system configured to perform a testing operation to a plurality of chips. The chip testing system includes a chip tray kit, an insertion member mounting apparatus, a chip testing apparatus, an insertion member detaching apparatus, and a conveying apparatus. The chip tray kit includes a tray, a plurality of chip fixing members, and a plurality of auxiliary insertion members. The tray has a plurality of tray thru-holes each penetrating through the tray. The chip fixing members are detachably fixed to the tray. Each of the chip fixing members is arranged in the corresponding one of the tray thru-holes, each of the chip fixing members includes a plurality of fixing thru-holes and a plurality of chip accommodating slots, each of the fixing thru-holes penetrates through the chip fixing member, each of the chip accommodating slots is in spatial communication with the corresponding one of the fixing thru-holes, each of the chip accommodating slots is configured to accommodate one of the chips, and a plurality of connection portions of the chip accommodated in the corresponding one of the chip accommodating slots are fixed through the chip. The auxiliary insertion members are detachably fixed to a side of the chip fixing members. Each of the auxiliary insertion members is configured to limit a movement range of the chips in the corresponding one of the chip fixing members relative to the chip fixing member. Each of the auxiliary insertion members includes a plurality of insertion thru-holes, and when each of the auxiliary insertion members is fixed to the side of the chip fixing members, each of the insertion thru-holes is in spatial communication with the corresponding one of the chip accommodating slots. The insertion member mounting apparatus is configured to mount the auxiliary insertion members onto the side of the chip fixing members. The chip testing apparatus includes at least one testing machine, at least one lid, a plurality of pressing assemblies, and a temperature adjusting device. The at least one testing machine is configured to be connected to the chip tray kit. The at least one testing machine is configured to perform the testing operation to the chips carried by the chip tray kit. The at least one lid has an accommodating slot formed at one side thereof. The at least one lid is configured to cover a side of the tray. The pressing assemblies are disposed on the at least one lid. Each of the pressing assemblies is arranged in the accommodating slot of the at least one lid, and the pressing assemblies are configured to press a plurality of surfaces of the chips carried by the chip fixing members of the chip tray kit. The temperature adjusting device is connected to the pressing assemblies. The temperature adjusting device is configured to allow a temperature of each of pressing members to reach a predetermined temperature. The insertion member detaching apparatus is configured to detach the auxiliary insertion members from the side of the chip fixing members. The conveying apparatus is configured to convey the chip tray kit.

Therefore, through the design of the pressing assemblies and the temperature adjusting device of the chip testing system of the present disclosure, when each of the chips is tested by the testing machine, the chip is pressed by the pressing member reaching the predetermined temperature. In this way, each of the chips can be stably connected to the testing machine and can be tested under the predetermined temperature.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
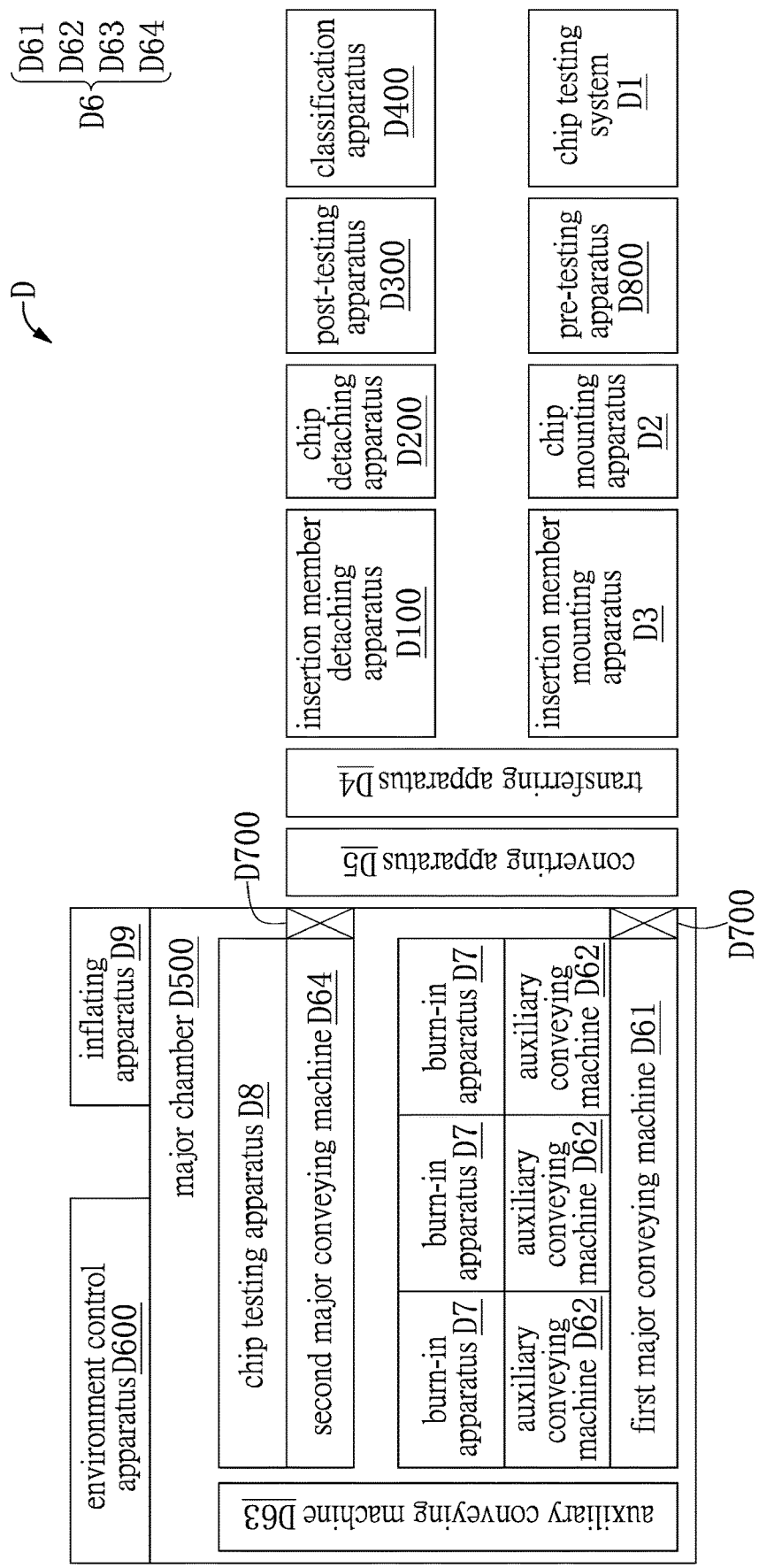
FIG. 1 is a schematic block diagram of a chip testing system of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

In the following description, if it is indicated that "reference is made to a specific figure" or "as shown in a specific figure", this is only to emphasize that in the description that follows, most content related thereto appears in said specific figure. However, the description that follows should not be construed as being limited to said specific figure only.

Figure 2:
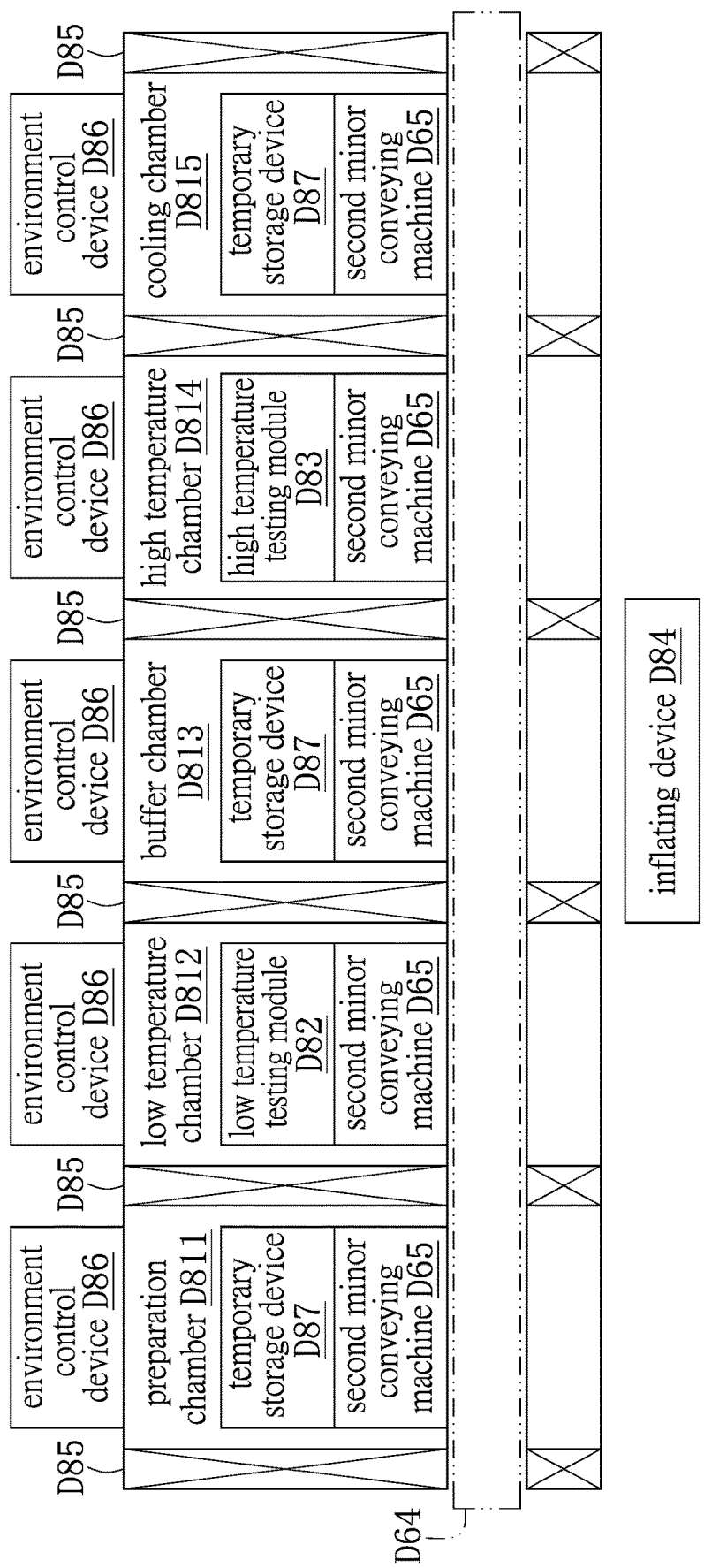
FIG. 2 is a schematic block diagram of a chip testing apparatus of the chip testing system of the present disclosure.

Referring to FIG. 1 and FIG. 2, FIG. 1 is a schematic block diagram of a chip testing system of the present disclosure, and FIG. 2 is a schematic block diagram of a chip testing apparatus of the chip testing system of the present disclosure. As shown in FIG. 1, a chip testing system D includes a feeding apparatus D1, a chip mounting apparatus D2, an insertion member mounting apparatus D3, a transferring apparatus D4, a converting apparatus D5, a conveying apparatus D6, a plurality of burn-in apparatuses D7, a chip testing apparatus D8, an inflating apparatus D9, an insertion member detaching apparatus D100, a chip detaching apparatus D200, a post-testing apparatus D300, and a classification apparatus D400. In other embodiments, the chip testing system D can be provided without including at least one of the feeding apparatus D1, the chip mounting apparatus D2, the converting apparatus D5, the burn-in apparatuses D7, the post-testing apparatus D300, the classification apparatus D400, and the inflating apparatus D9.

Figure 3:
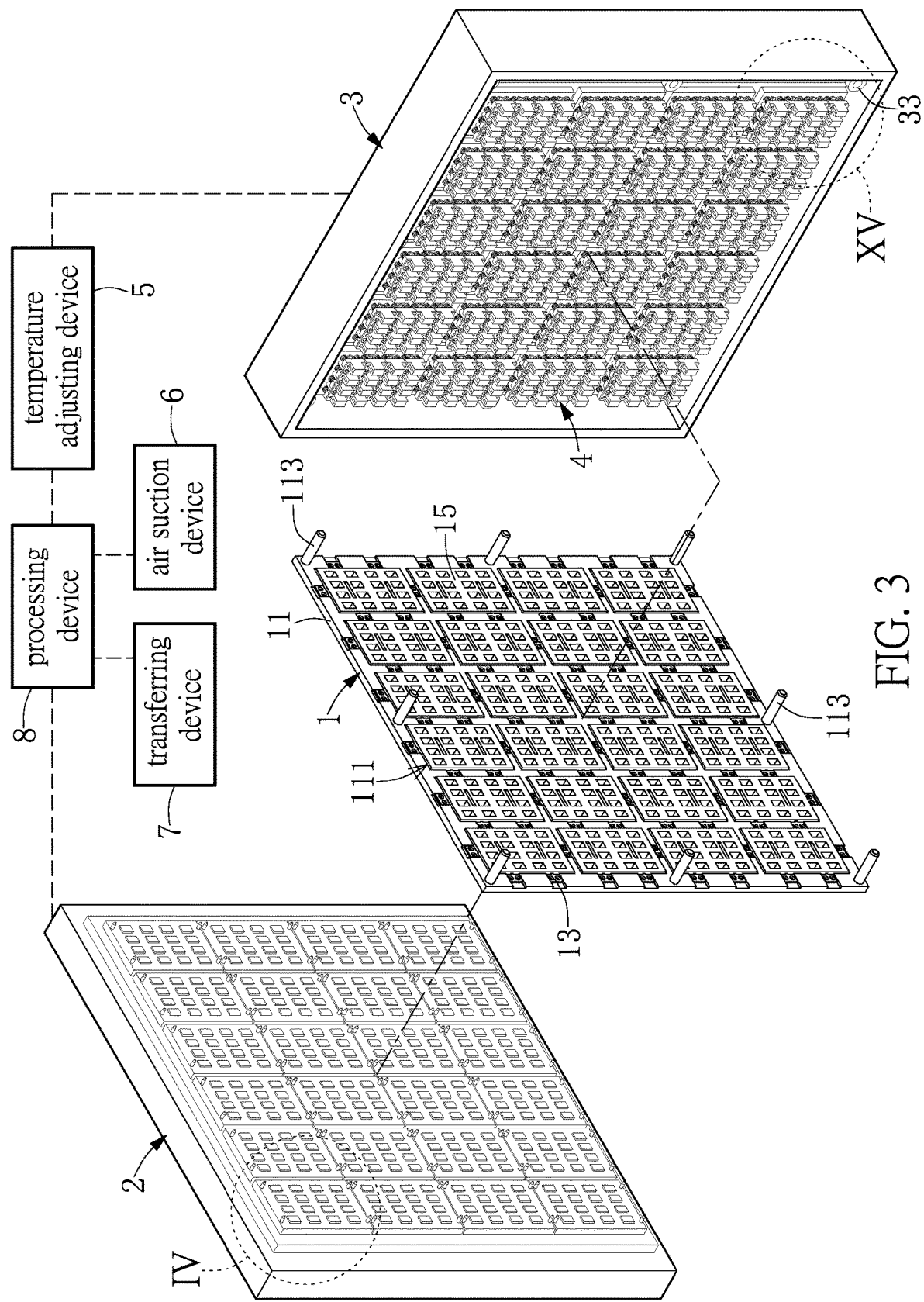
FIG. 3 is a schematic view of the chip testing apparatus of the present disclosure.
Figure 5:
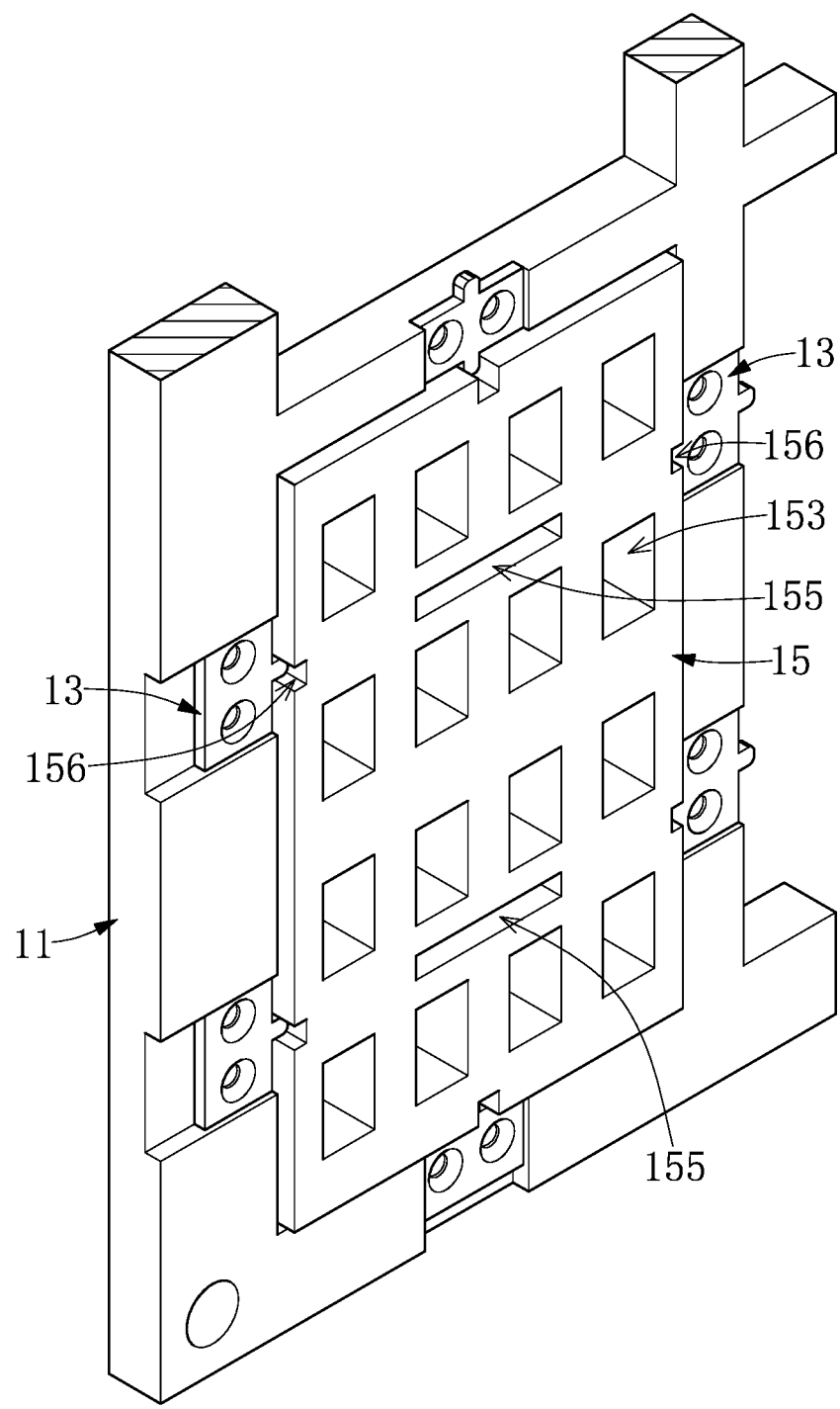
FIG. 5 and FIG. 6 are partial enlarged views of a chip tray kit of the present disclosure from different perspectives.
Figure 6:
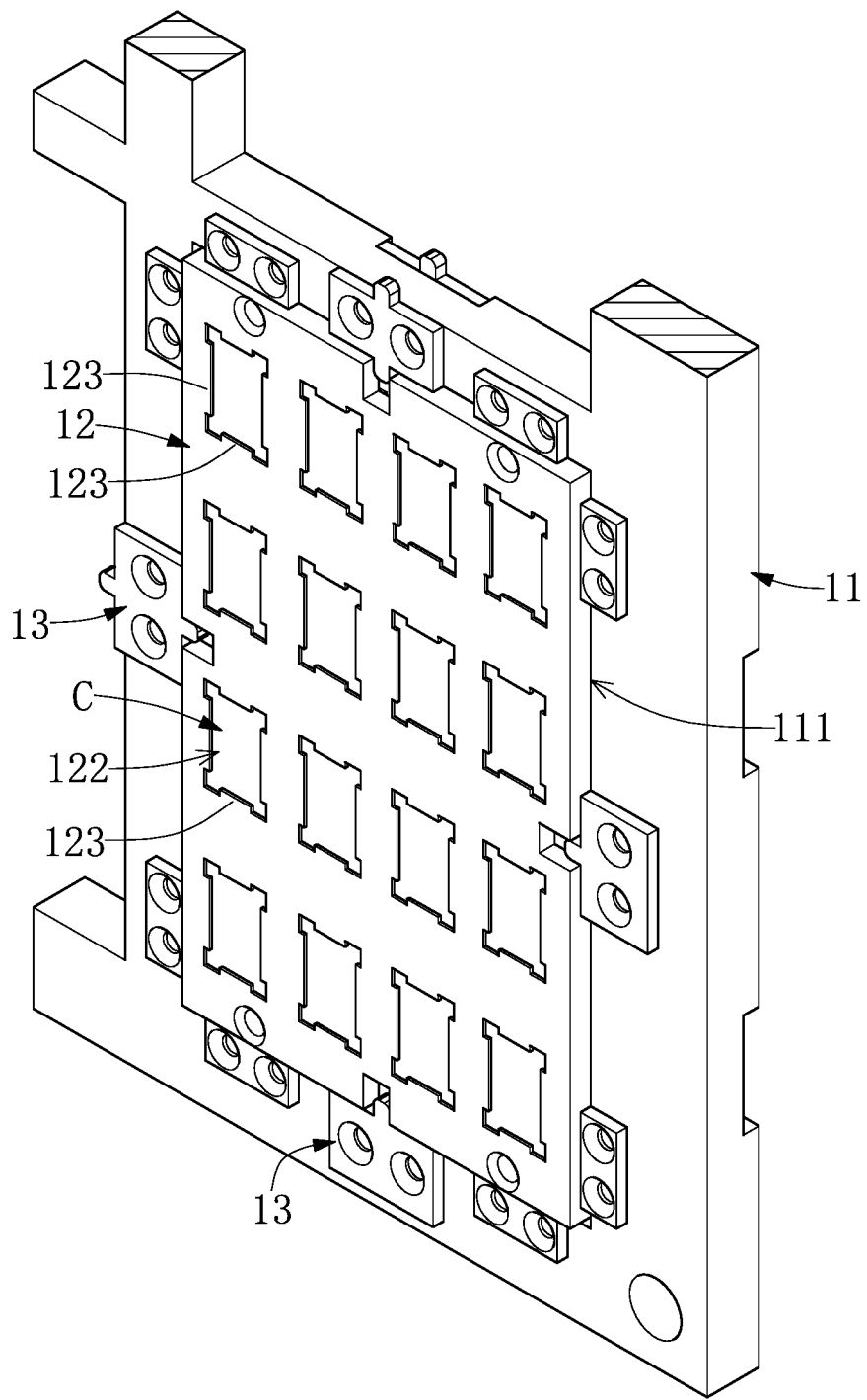
Figure 7:
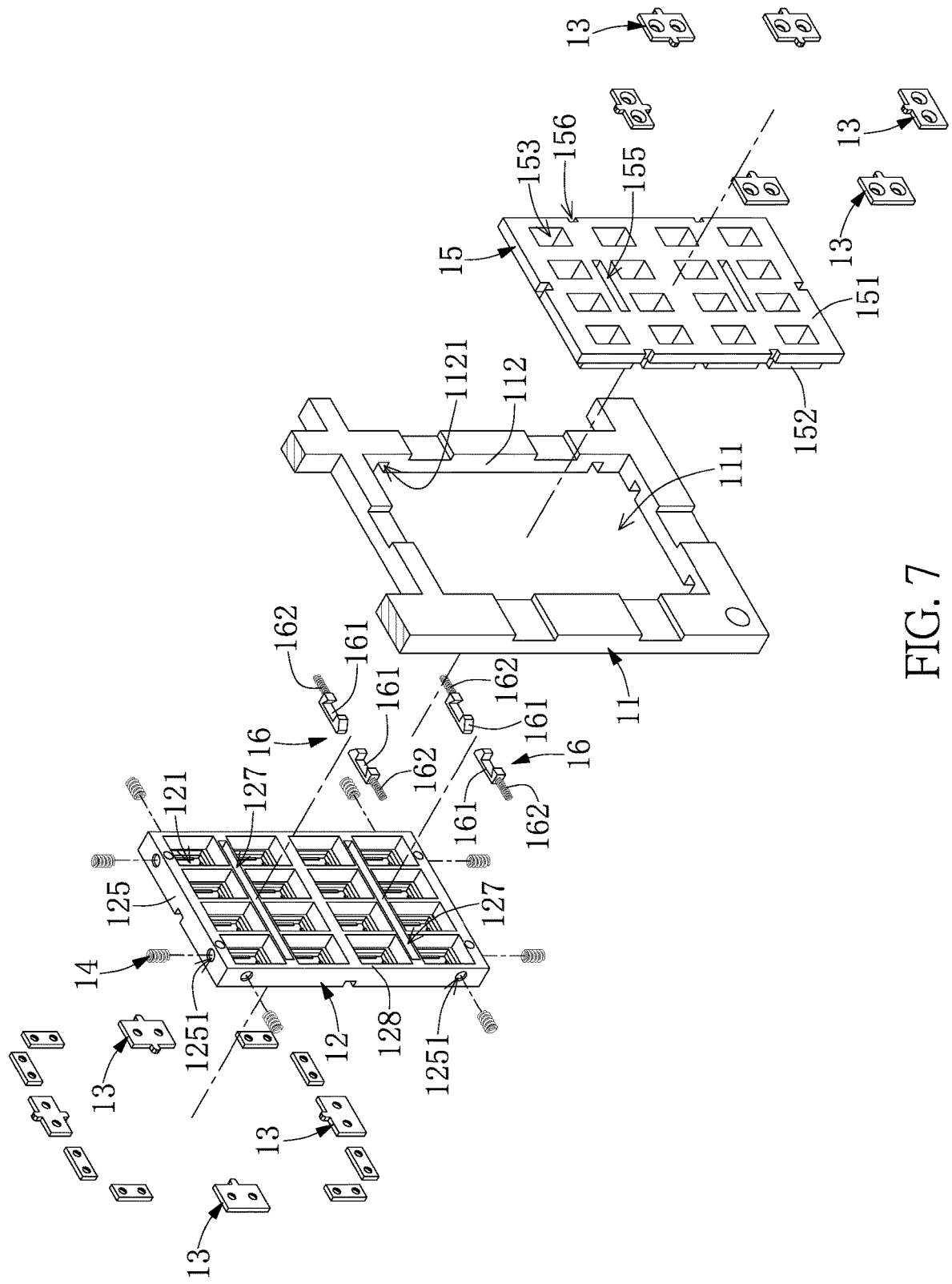
FIG. 7 and FIG. 8 are partial exploded views of the chip tray kit of the present disclosure from different perspectives.

The feeding apparatus D1 is configured to transfer a plurality of chips C (as shown in FIG. 6). The chip mounting apparatus D2 is configured to mount the chips C transferred by the feeding apparatus D1 into a plurality of chip accommodating slots 122 (as shown in FIG. 7 and will be mentioned as follows) of each of a plurality of chip fixing members 12 (as shown in FIG. 3 and FIG. 7 and will be mentioned as follows) of a chip tray kit 1 (as shown in FIG. 3 and will be mentioned as follows). In a practical application, the chip mounting apparatus D2 can include a transferring machine and a plurality of suckers, and the transferring machine can be in cooperation with the suckers to suck one or a plurality of the chips C at the same time, so that the chips C can be disposed in the chip fixing members 12 in a tray 11 (as shown in FIG. 5 and will be mentioned as follows). Naturally, in a practical application, the chip mounting apparatus D2 can include various types of machines according to different types of the chips C. In a practical application, the transferring apparatus D4 can further include a related machine or device configured to transfer the chip tray kit 1, and the related machine or device is configured to dispose the chip tray kit 1 into the chip mounting apparatus D2.

The insertion member mounting apparatus D3 is configured to fix a plurality of auxiliary insertion members 15 (as shown in FIG. 5 and FIG. 7 and will be mentioned as follows) to a side of each of the chip fixing members 12 (as shown in FIG. 3 and FIG. 7 and will be mentioned as follows) accommodating the chips C. For example, the insertion member mounting apparatus D3 can include a carrier, a holding machine (not shown), and a carrying machine. One or a plurality of the chip tray kits 1 already having the chip fixing members 12 and the chips C disposed thereon is/are disposed on the carrier, the holding machine is configured to hold one or a plurality of the auxiliary insertion members 15, the carrying machine is connected the holding machine, and the carrying machine is configured to transfer the holding machine, so that one or a plurality of the auxiliary insertion members 15 held by the holding machine is/are fixed to the side of the chip fixing members 12 of the chip tray kit 1 (as shown in FIG. 3) arranged on the carrier.

Figure 11:
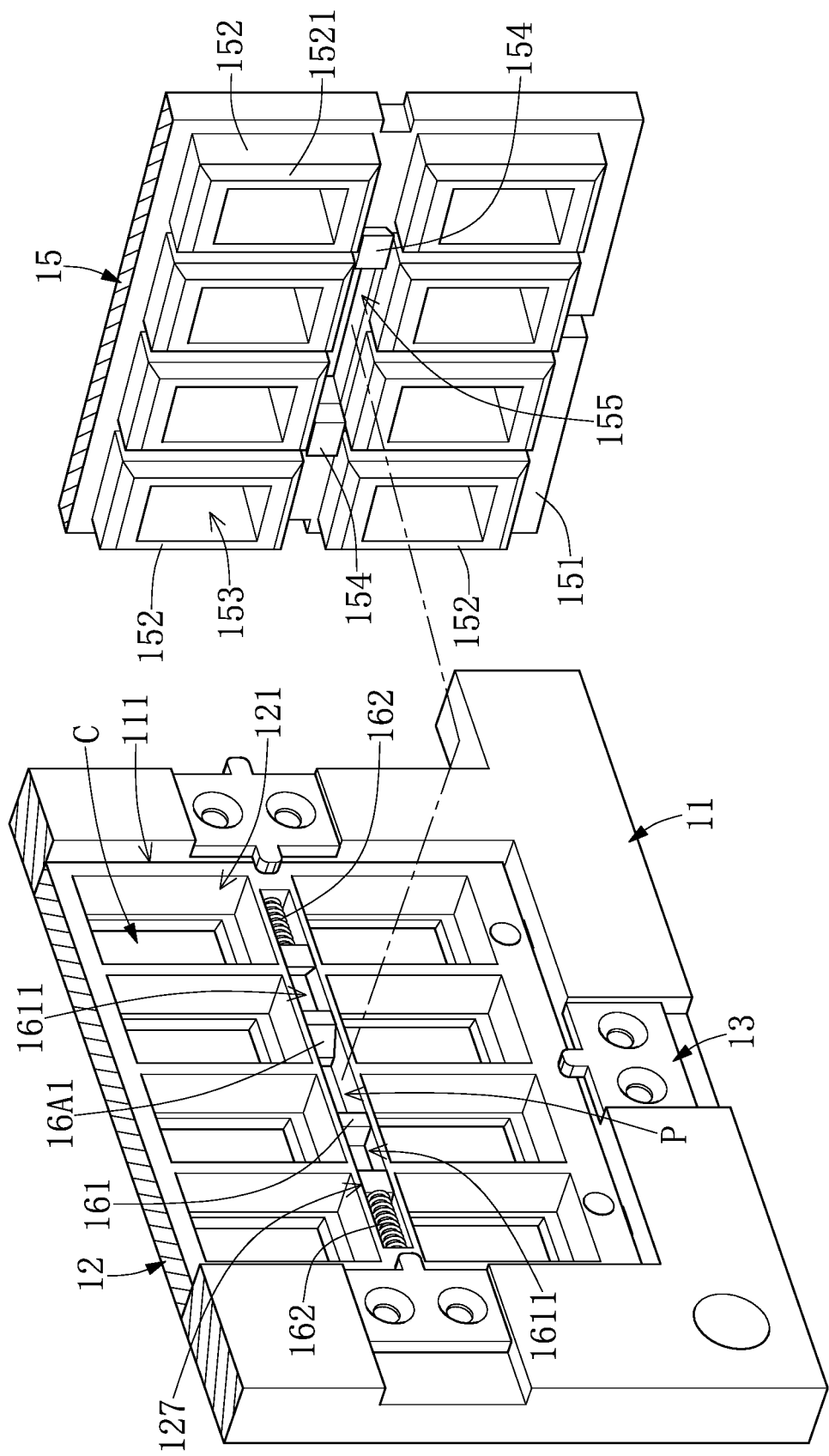
FIG. 11 is a partial exploded view of the chip tray kit of the present disclosure.
Figure 12:
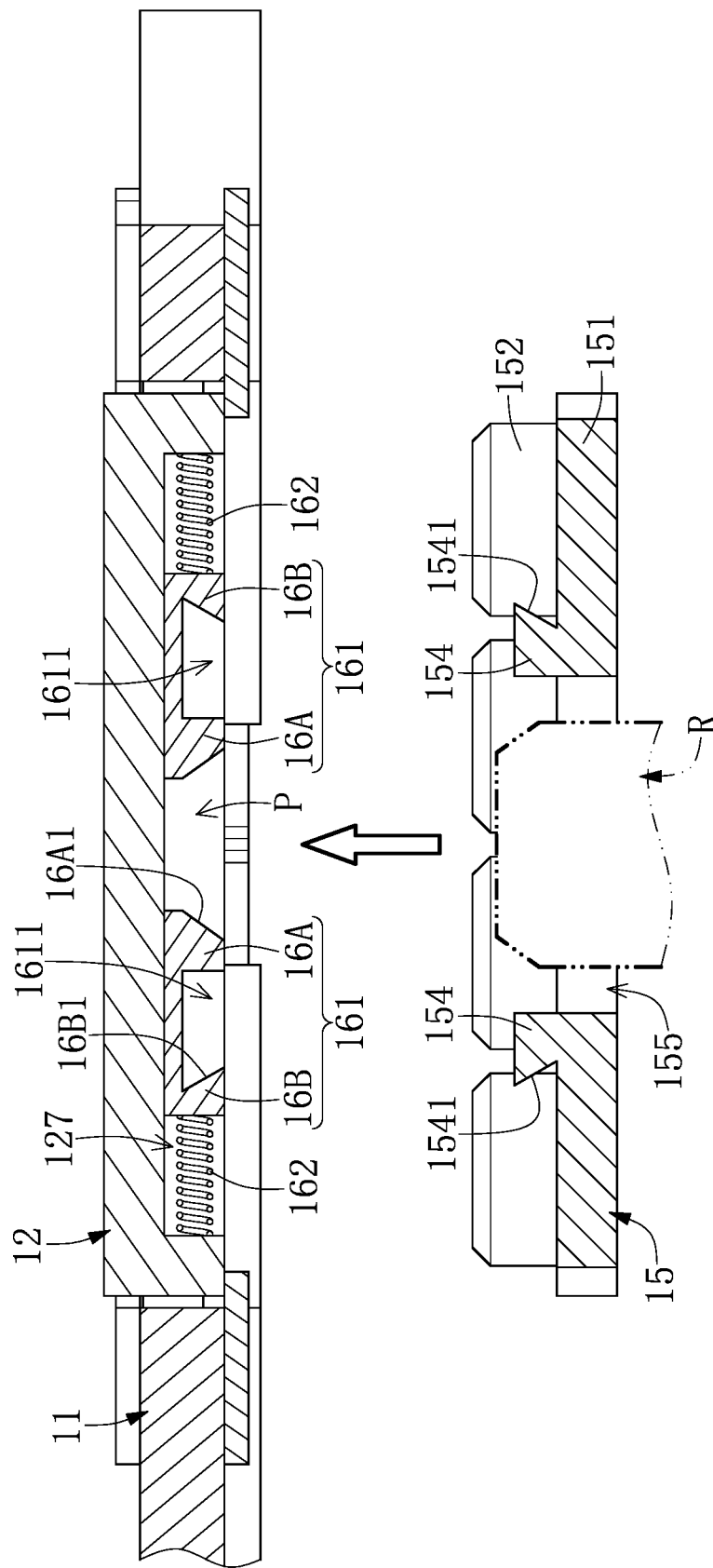
FIG. 12 to FIG. 14 are operational schematic views of an auxiliary insertion member of the chip tray kit being fixed with a chip fixing member according to the present disclosure.
Figure 13:
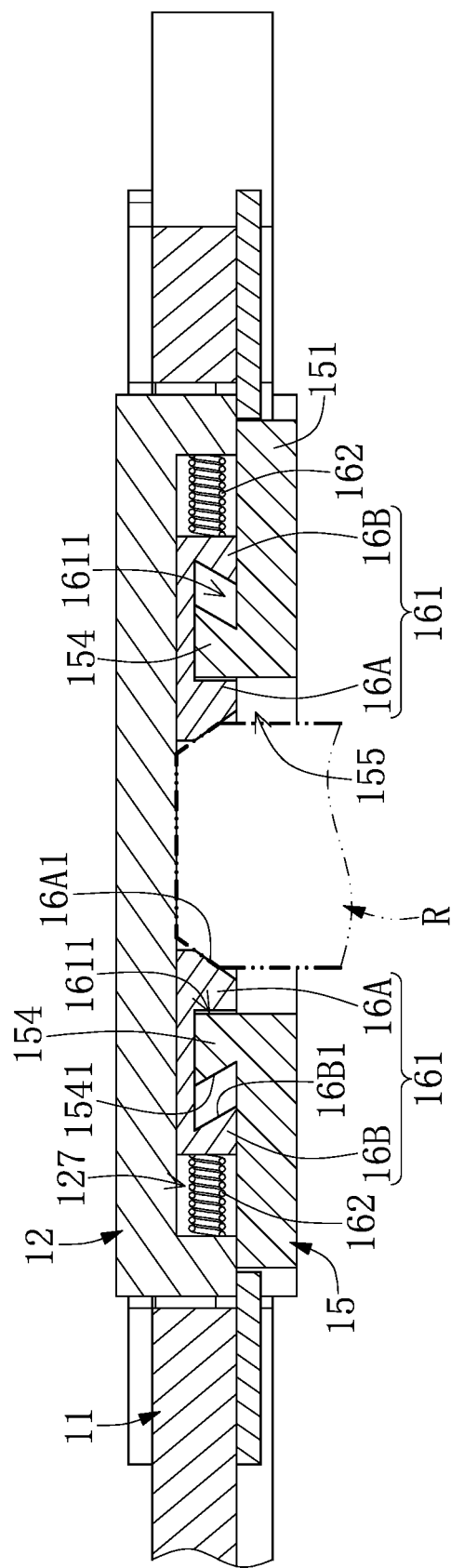
Figure 14:
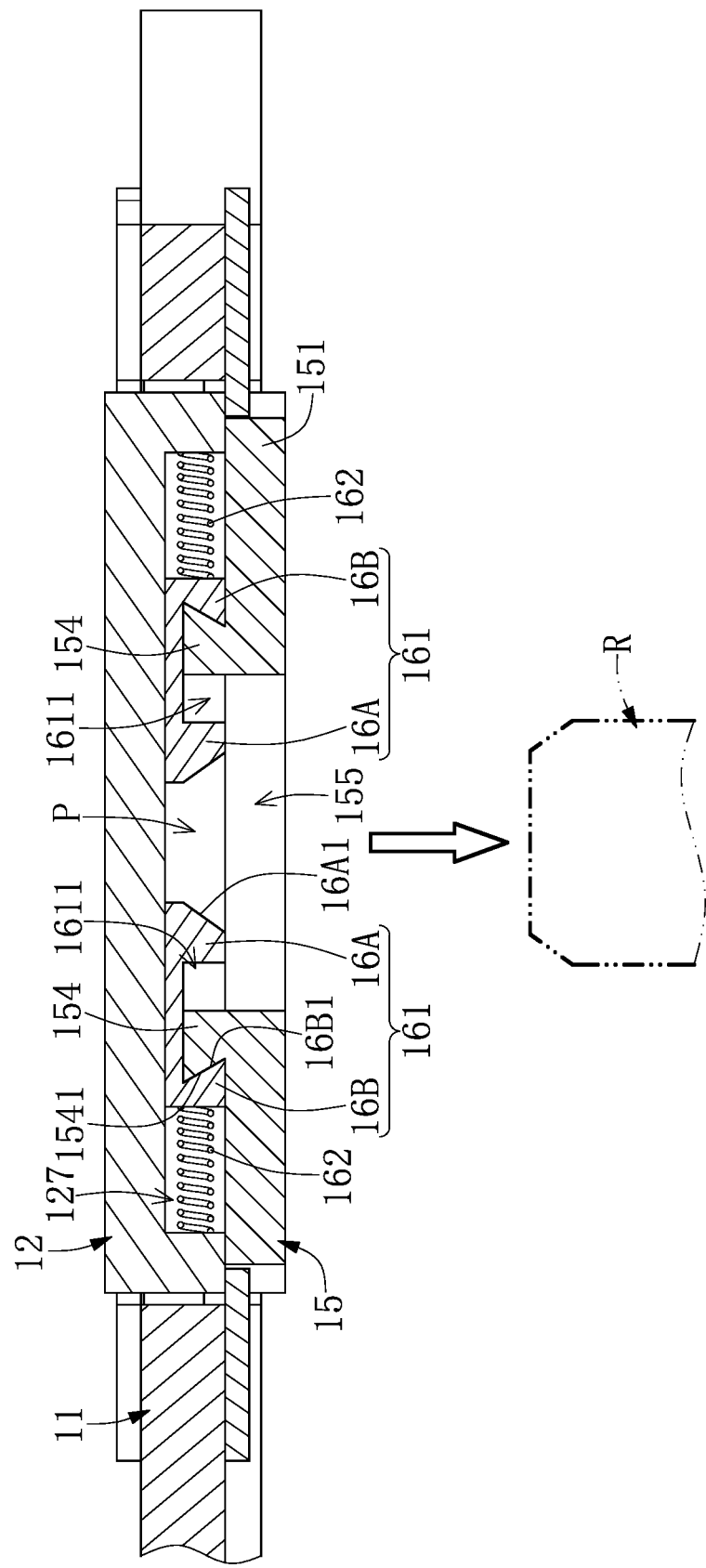

In an embodiment of the present disclosure, each of the chip fixing members 12 (as shown in FIG. 7) has a plurality of quick release assemblies 16 (as shown in FIG. 7 and FIG. 11 and will be mentioned as follows) disposed thereon, and the insertion member mounting apparatus D3 can include a plurality of insertion members R (as shown in FIG. 12 to FIG. 14 and will be mentioned as follows). In a practical application, the chip mounting apparatus D2 and the insertion member mounting apparatus D3 can be incorporated into one machine. The quantity of the chip mounting apparatus D2 and the quantity of the insertion member mounting apparatus D3 are not limited to one, and can be increased according to practical requirements.

The transferring apparatus D4 is configured to transfer the chip tray kit 1 (as shown in FIG. 1) having the auxiliary insertion members 15 (as shown in FIG. 5 and FIG. 7) disposed thereon and carrying the chips C to the converting apparatus D5. It should be noted that after the auxiliary insertion members 15 are mounted onto the side of the chip fixing members 12 of the tray 11 (as shown in FIG. 7) by the insertion member mounting apparatus D3, each of the auxiliary insertion members 15 is stably connected to the corresponding one of the chip fixing members 12. Therefore, when the transferring apparatus D4 transfers the chip tray kit 1 having the auxiliary insertion members 15 disposed thereon, the transferring apparatus D4 can directly hold the tray 11, and the transferring apparatus D4 can be provided without including the machine (or structure) configured to hold the auxiliary insertion members 15 on the chip tray kit 1.

The converting apparatus D5 is configured to convert the chip tray kit 1 (as shown in FIG. 3) from a parallel state to a vertical state (i.e., a state shown in FIG. 3). After the chip tray kit 1 passes through the insertion member mounting apparatus D3, the auxiliary insertion members 15 (as shown in FIG. 5 and FIG. 7) are already fixed to the side of each of the chip fixing members 12 (as shown in FIG. 6 and FIG. 7), and the chips C disposed in the chip fixing members 12 are jointly limited by the chip fixing members 12 and the auxiliary insertion members 15. Therefore, when the converting apparatus D5 converts the chip tray kit 1 from the parallel state to the vertical state, the chips C disposed in the chip tray kit 1 do not leave the chip tray kit 1.

Through the auxiliary insertion members 15 (as shown in FIG. 5 and FIG. 7) and the converting apparatus D5, when the chip tray kit 1 (as shown in FIG. 3) is transferred among the apparatuses of the chip testing system D, the chip tray kit 1 can be maintained in the vertical state. Therefore, a space that the chip tray kit 1 requires when being transferred can be decreased, thereby decreasing a space that the chip testing system D requires.

In other embodiments, the chip testing system D can be provided without including the converting apparatus D5, and when the chip tray kit 1 (as shown in FIG. 3) is transferred among the apparatuses of the chip testing system D, the chip tray kit 1 can be maintained in the parallel state. In a practical application, the transferring apparatus D4 and the converting apparatus D5 can respectively be a machine for holding the chip tray kit 1 and a machine for transferring the chip tray kit 1. For example, the transferring apparatus D4 and the converting apparatus D5 can be machines having robotic arms.

The conveying apparatus D6 is disposed near the converting apparatus D5. The conveying apparatus D6 can include a first major conveying machine D61, three first minor conveying machines D62, an auxiliary conveying machine D63, a second major conveying machine D64, and two second minor conveying machines D65 (as shown in FIG. 2). The first major conveying machine D61 is disposed near the burn-in apparatuses D7, and one of the first minor conveying apparatuses D62 is disposed between each of the burn-in apparatuses D7 and the first major conveying machine D61.

The converting apparatus D5 is configured to transfer the chip tray kit 1 (as shown in FIG. 3) to the first major conveying machine D61. The first major conveying machine D61 is configured to convey the chip tray kit (as shown in FIG. 3) passing a test performed by the burn-in apparatus D7 to the chip testing apparatus D8 or the auxiliary conveying machine D63. Each of the first minor conveying machines D62 is configured to allow the chip tray kit 1 arranged at the first major conveying machine D61 to be connected to the burn-in apparatus D7, and each of the first minor conveying machines D62 is further configured to separate the chip tray kit 1 and the burn-in apparatus D7 and is configured to convey the chip tray kit 1 to the first major conveying machine D61.

Each of the burn-in apparatuses D7 is configured to perform a burn-in test to the chips C carried by the chip tray kit 1 (as shown in FIG. 3) connected thereto. As shown in FIG. 3, in a practical application, each of the burn-in apparatuses D7 can include a testing machine 2, a lid 3, a plurality of pressing assemblies 4, a temperature adjusting device 5, an air suction device 6, and a transferring device 7, but the present disclosure is not limited thereto. An operational relationship among the testing machine 2, the lid 3, the pressing assemblies 4, the temperature adjusting device 5, the air suction device 6, and the transferring device 7 will be mentioned as follows.

As shown in FIG. 1, the chip testing system D includes three burn-in apparatuses D7, but the quantity of the burn-in apparatuses D7 included by the chip testing system D is not limited thereto. In an embodiment shown in FIG. 1, the converting apparatus D5 can continuously transfer three chip tray kits 1 (as shown in FIG. 3) to the first major conveying machine D61, and the three first minor conveying machines D62 can sequentially transfer one of the chip tray kits 1 arranged at the first major conveying machine D61 from the first major conveying machine D61 to the corresponding burn-in apparatus D7. Afterwards, the three burn-in apparatuses D7 can respectively perform the burn-in tests to the chips C carried by the three chip tray kits 1. When any one of the burn-in apparatuses D7 finishes the burn-in test performed to the chips C carried by the chip tray kit 1, the corresponding one of the first minor conveying machines D62 conveys the chip tray kit 1 to the first major conveying machine D61, and the first major conveying machine D61 conveys the chip tray kit 1 to the auxiliary conveying machine D63.

It should be noted that in other embodiments, one of the burn-in apparatuses D7 can also perform the burn-in tests to the chips C carried by at least two of the chip tray kits 1. In other words, in a practical application, one of the burn-in apparatuses D7 can perform the burn-in tests to the chips C carried by one or a plurality of the chip tray kits 1.

As shown in FIG. 1 and FIG. 2, the auxiliary conveying machine D63 is configured to convey the chip tray kit 1 (as shown in FIG. 3) passing the burn-in test from the first major conveying machine D61 to the second major conveying machine D64. The second major conveying machine D64 and the second minor conveying machines D65 can cooperatively allow the chip tray kit 1 to be connected to the chip testing apparatus D8, so that the chip testing apparatus D8 can test the chips C carried by the chip tray kit 1. Also, the second major conveying machine D64 and the second minor conveying machines D65 can cooperatively separate the chip tray kit 1 and the chip testing apparatus D8 from one another.

It should be noted that in FIG. 1, the first major conveying machine D61 and the second major conveying machine D64 are substantially disposed parallel to each other, and the chip tray kit 1 (as shown in FIG. 3) arranged at the first major conveying machine D61 is conveyed to the second major conveying machine D64 through the auxiliary conveying machine D63. In an embodiment of the present disclosure, the burn-in apparatuses D7 and the chip testing apparatus D8 are disposed parallel to each other, the first major conveying machine D61 can be directly connected to the second major conveying machine D64, and the chip testing system D can be provided without including the auxiliary conveying machine D63.

In a practical application, the first major conveying machine D61, the first minor conveying machines D62, the second major conveying machine D64, and the second minor conveying machines D65 can include a slide rail assembly, pneumatic cylinder (or hydraulic cylinder), a machine for holding the chip tray kit 1 (as shown in FIG. 3), and a detector for detecting whether the chip tray kit 1 is connected to or separated from the chip testing apparatus D8 or the burn-in apparatus D7, but the present disclosure is not limited thereto. The quantity of the conveying machines included by the conveying apparatus D6 can be changed according to the quantity and arranged position of the burn-in apparatuses D7 and the chip testing apparatus D8, and is not limited to that shown in FIG. 1.

In a preferable embodiment, the chip testing system D can further include a major chamber D500, an environment control apparatus D600, and two major movable doors D700. The chip testing apparatus D8, each of the burn-in apparatuses D7, the first major conveying machine D61, the three second minor conveying machines D65, the auxiliary conveying machine D63, the second main conveying machine D64, and the second minor conveying machines D65 included by the conveying apparatus D6 are disposed in the major chamber D500. The inflating apparatus D9 is configured to fill the major chamber D500 with a super dry air (specifically, a clean super dry air).

The major chamber D500 includes an inlet and an outlet, and the two major movable doors D700 are respectively disposed at the inlet and the outlet. The major chamber D500 is primarily in spatial communication with the external environment through the inlet and the outlet, and the two major movable doors D700 are primarily configured to keep the major chamber D500 from being in spatial communication with the external environment, so as to maintain an environment state (e.g., temperature, humidity, or a content of a specific gas) in the major chamber D500. Basically, the major movable doors D700 are open only when the chip tray kit 1 enters or leaves the major chamber D500. Except for the time when the chip tray kit 1 enters or leaves the major chamber D500, the major movable doors D700 are basically kept closed, but the present disclosure is not limited thereto.

In a practical application, the inflating apparatus D9 can continuously deliver the clean super dry air into the major chamber D500. Or, the inflating apparatus D9 can continuously monitor a content of the clean super dry air in the major chamber D500 and environment parameters such as the temperature and the humidity in the major chamber D500. The inflating apparatus D9 can automatically deliver the clean super dry air into the major chamber D500 when the content of the clean super dry air is less than a predetermined content or when the environment parameter such as the temperature or the humidity in the major chamber D500 is greater than a predetermined value, but the present disclosure is not limited thereto.

In a preferable embodiment, when any one of the major movable doors D700 is open, the inflating apparatus D9 can be controlled to be operated, so that the inflating apparatus D9 delivers the clean super dry air into the major chamber D500. Or, the inflating apparatus D9 can deliver a greater amount of the clean super dry air into the major chamber D500 to ensure that the content of the clean super dry air in the major chamber D500 is greater than or equal to the predetermined content.

The environment control apparatus D600 is configured to control the environment state (e.g., temperature and humidity) in the major chamber D500. Through the inflating apparatus D9 and the environment control apparatus D600, when the chips C carried by the chip tray kit 1 (as shown in FIG. 3) are transferred, impurities such as dust do not easily adhere to the chips C, and a temperature of each of the chips C carried by the chip tray kit 1 can be substantially the same as the temperature of the major chamber D500.

As shown in FIG. 2, FIG. 2 is a schematic view of a chip testing apparatus of the chip testing system of the present disclosure. The chip testing apparatus D8 can include five chambers, a low temperature testing module D82, a high temperature testing module D83, at least one inflating device D84, at least six movable doors D85, six environment control devices D86, and three temporary storage devices D87. In other embodiments, the chip testing apparatus D8 can be provided without including the environment control devices D86 and the temporary storage devices D87.

The five chambers are respectively defined as a preparation chamber D811, a low temperature chamber D812, a buffer chamber D813, a high temperature chamber D814, and a cooling chamber D815. The low temperature chamber D812 is arranged between the preparation chamber D811 and the buffer chamber, and the buffer chamber D813 is arranged between the low temperature chamber D812 and the high temperature chamber D814. Each of the five chambers has the movable doors D85 disposed at an inlet and an outlet thereof. The high temperature chamber D814 is arranged between the buffer chamber D813 and the cooling chamber D815.

A temperature in the preparation chamber D811 is less than a room temperature (e.g., 25° C.) and greater than a temperature in the low temperature chamber D812, the temperature in the low temperature chamber D812 is within a range from −50° C. to 20° C., a temperature in the buffer chamber D813 is greater than the temperature in the low temperature chamber D812 and less than a temperature in the high temperature chamber D814, and the temperature in the high temperature chamber D814 is within a range from 25° C. to 150° C. A temperature in the cooling chamber D815 is less than the temperature in the high temperature chamber D814 and greater than the room temperature. In other embodiments, the chip testing apparatus D8 can be provided without including the cooling chamber D815.

The low temperature testing module D82 is disposed in the low temperature chamber D812, and the low temperature testing module D82 is configured to be in contact with the chips C carried by the chip tray kit 1 (as shown in FIG. 3), so that the chips C can be tested in a low temperature state. The high temperature testing module D83 is disposed in the high temperature chamber D814, and the high temperature testing module D83 is configured to be in contact with the chips C carried by the chip tray kit 1, so that the chips C can be tested in a high temperature state.

The second major conveying machine D64 is configured to convey the chip tray kit 1 among the preparation chamber D811, the low temperature chamber D812, the buffer chamber D813, the high temperature chamber D814, and the cooling chamber D815. Every one of the preparation chamber D811, the buffer chamber D813, and the cooling chamber D815 has one of the temporary storage devices D87 and one of the second minor conveying machines D65 disposed therein. Each of the temporary storage devices D87 is configured to store at least one of the chip tray kits 1, and each of the second minor conveying machines D65 is configured to convey the chip tray kit 1 between the temporary storage device D87 and the second major conveying machine D64.

One of the second minor conveying machines D65 is arranged between the low temperature testing module D82 and the second major conveying machine D64, the second minor conveying machine D65 is configured to convey the chip tray kit 1 (as shown in FIG. 3) between the second major conveying machine D64 and the low temperature testing module D82, and the second minor conveying machine D65 is configured to allow the chips C carried by the chip tray kit 1 to be in contact with the low temperature testing module D82, so that the low temperature testing module D82 can perform a low temperature test to the chips C. A test content performed by the low temperature testing module D82 to the chips C can be determined according to the type of the chips C and practical requirements, and the present disclosure is not limited thereto.

One of the second minor conveying machines D65 is arranged between the high temperature testing module D83 and the second major conveying machine D64, the second minor conveying machine D65 is configured to convey the chip tray kit 1 (as shown in FIG. 3) between the second major conveying machine D64 and the high temperature testing module D83, and the second minor conveying machine D65 is configured to allow the chips C carried by the chip tray kit 1 to be in contact with the high temperature testing module D83, so that the high temperature testing module D83 can perform a high temperature test to the chips C. A test content performed by the high temperature testing module D83 to the chips C can be determined according to the type of the chips C and practical requirements, and the present disclosure is not limited thereto.

The inflating device D84 is configured to fill a super dry air (specifically, clean super dry air) into each of the chambers. The inflating device D84 mentioned herein and the inflating apparatus D9 are the same, and will not be reiterated herein. Each of the environment control devices D86 is configured to monitor and adjust an environment state (e.g., temperature or humidity) in each of the chambers. Each of the chambers has the movable doors D85 disposed at the inlet and the outlet thereof, and each of the movable doors D85 is configured to allow the chamber to be in an enclosed state, so as to maintain a predetermined temperature, a predetermined humidity, a predetermined content of the super dry air in the chamber. In a preferable embodiment, when any one of the movable doors D85 is open, the inflating device D84 can be controlled to fill the corresponding chamber with the super dry air.

According to the above, the chip tray kit 1 (as shown in FIG. 3) arranged at the second major conveying machine D64 is sequentially in cooperation with each of the second minor conveying machines D65, so that the chip tray kit 1 sequentially moves into the temporary storage device D87 of the preparation chamber D811, the low temperature testing module D82 of the low temperature chamber D812, the temporary storage device D87 of the buffer chamber D813, the high temperature testing module D83 of the high temperature chamber D814, and the temporary storage device D87 of the cooling chamber D815. When the chip tray kit 1 is moved into the temporary storage device D87 of the preparation chamber D811, the temperature of each of the chips C carried by the chip tray kit 1 gradually decreases to a temperature substantially equal to the temperature of the preparation chamber D811. Afterwards, the chip tray kit 1 is moved into the low temperature chamber D812, and the low temperature testing module D82 performs the low temperature tests to the chips C. After the low temperature tests performed to the chips C are completed, the chip tray kit 1 is moved into the buffer chamber D813, and the temperature of each of the chips C of the chip tray kit 1 is gradually increased to a temperature substantially equal to the temperature of the buffer chamber D813. Afterwards, the chip tray kit 1 is moved into high temperature chamber D814, and the high temperature testing module D83 performs the high temperature tests to the chips C. After the high temperature tests performed to the chips C are completed, the chip tray kit 1 is moved into the temporary storage device D87 of the cooling chamber D815. It is not until the temperature of each of the chips C is cooled down to a temperature substantially equal to the temperature of the cooling chamber D815 that the chip tray kit 1 is moved to the second major conveying machine D64.

In other embodiments, the chip tray kit 1 can be sequentially moved into the temporary storage device D87 of the buffer chamber D813, the high temperature testing module D83 of the high temperature chamber D814, the temporary storage device D87 of the cooling chamber D815, the temporary storage device D87 of the preparation chamber D811, and the low temperature testing module D82 of the low temperature chamber D812. In a special application, the chip testing apparatus D8 can only include the buffer chamber D813, the high temperature chamber D814, and the cooling chamber D815. Or, the chip testing apparatus D8 can only include the preparation chamber D811, the low temperature chamber D812, and the buffer chamber D813.

Since the clean super dry air is filled into the preparation chamber D811, the low temperature chamber D812, the buffer chamber D813, the high temperature chamber D814, and the cooling chamber D815 with the chips C sequentially entering the chambers, the temperature of each of the chips is gradually increased or decreased. Therefore, an issue about condensation or frosting on a surface of each of the chips C does not easily occur, and the chips C are not damaged because of drastic temperature changes.

As shown in FIG. 1 to FIG. 3, after the low temperature tests and the high temperature tests are sequentially performed to the chip tray kit 1 in the chip testing apparatus D8, the chip tray kit 1 is moved to the second major conveying machine D64. Then, the converting apparatus D5 and the transferring apparatus D4 convert the chip tray kit 1 arranged at the second major conveying machine D64 to the parallel state and transfer the chip tray kit 1 to the insertion member detaching apparatus D100. The insertion member detaching apparatus D100 is configured to detach the auxiliary insertion members 15 of the chip tray kit 1, so that the chips C arranged in the chip accommodating slots 122 are exposed. Afterwards, the chip detaching apparatus D200 takes out the chips C from the chip accommodating slots 122. In a practical application, the insertion member detaching apparatus D100 and the chip detaching apparatus D200 can be two independent apparatuses, but can be also incorporated into one apparatus.

After the chip detaching apparatus D200 takes out the chips C from the chip accommodating slots 122, the chips C are moved to a post-testing apparatus D300, and the post-testing apparatus D300 performs a post-test to each of the chips C. After the post-testing apparatus D300 finishes the post-tests to the chips C, the chips C are moved to the classification apparatus D400. The classification apparatus D400 classifies each of the chips C according to test results of the burn-in test, the low temperature test, the high temperature test, and the post-test.

In a practical application, the burn-in apparatus D7, the low temperature testing module D82, and the high temperature testing module D83 mentioned above can be the same apparatus. As shown in FIG. 3, in an embodiment of the present disclosure, every one of the burn-in apparatus D7, the low temperature testing module D82, and the high temperature testing module D83 can include the testing machine 2, the lid 3, the pressing assemblies 4, the temperature adjusting device 5, the air suction device 6, the transferring device 7, and a processing device 8.

As shown in FIG. 1, in other embodiments, the chip testing system D can further include a pre-testing apparatus D800, the pre-testing apparatus D800 can be disposed near a position between the feeding apparatus D1 and the chip mounting apparatus D2, and the transferring apparatus D4 can transfer the chips C from the feeding apparatus D1 to the pre-testing apparatus D800, so that the pre-testing apparatus D800 can perform an open/short test and a leakage test to each of the chips. If each of the chips C passes a pre-test (i.e., the open/short test and the leakage test), each of the chips C is transferred to the chip mounting apparatus D2.

Figure 4:
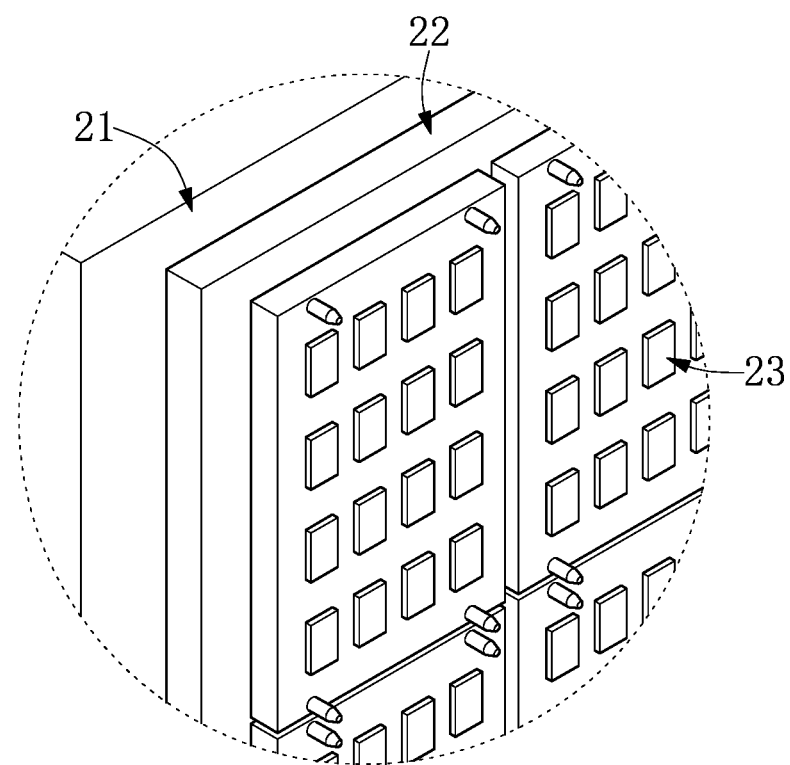
FIG. 4 is a partial enlarged view of FIG. 3.
Figure 10:
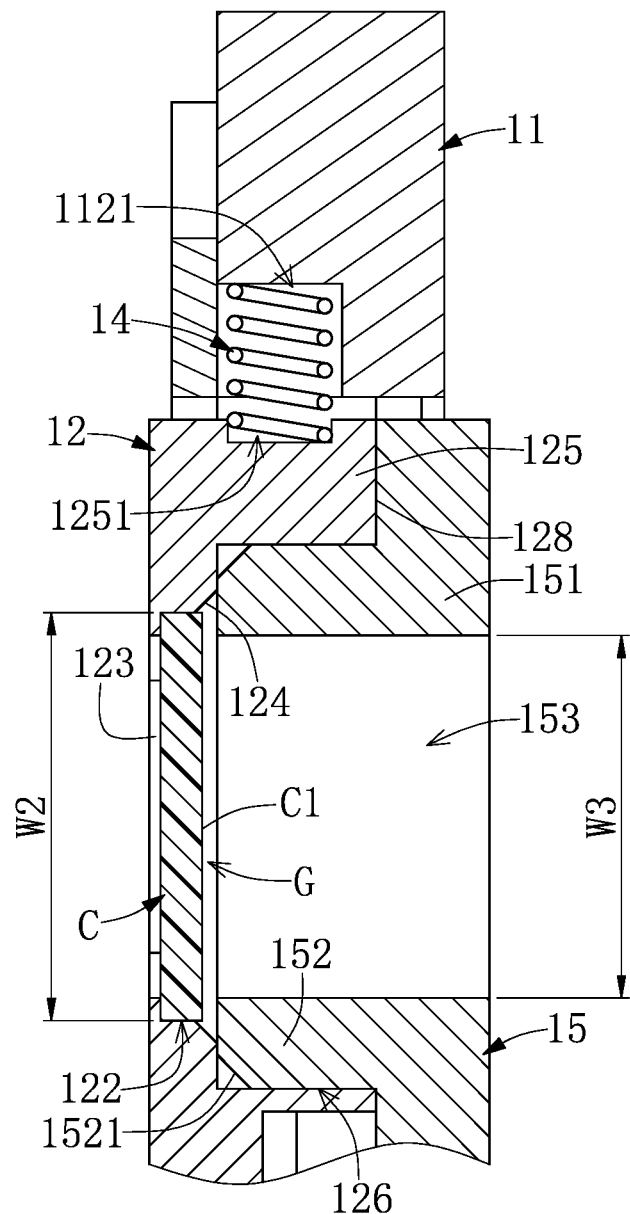
FIG. 10 is a partial sectional view of the chip tray kit having a chip disposed therein according to the present disclosure.

The testing machine 2 and the lid 3 are configured to jointly hold one of the chip tray kits 1. As shown in FIG. 3 and FIG. 4, the testing machine 2 can be connected to the chip tray kit 1, the testing machine 2 is configured to be electrically connected to the chips C (as shown in FIG. 10) carried by the chip tray kit 1, and the testing machine 2 is configured to test the chips C. A testing content performed by the testing machine 2 to each of the chips C can be designed according to practical kinds and requirements of the chips C, and the present disclosure is not limited thereto. In a practical application, the testing machine 2 can include a machine body 21, a control set 22 disposed on the machine body 21, and a plurality of probe sockets 23. Each of the probe sockets 23 includes a plurality of probes (not shown), and the probes of the probe sockets 23 are configured to be electrically connected to the chips C under test. The control set 22 is configured to perform a related testing process to test the chips C (as shown in FIG. 10) under test through the probe sockets 23. In a practical application, the machine body 21 can include a structure (not shown) to be fixed with the chip tray kit 1, the machine body 21 or each of the probe sockets 23 can include a structure (not shown) to auxiliary limit the chips C, but the present disclosure is not limited thereto. The control set 22 can be a circuit board, a microprocessor or a control circuit.

As shown in to FIG. 3 and FIG. 5 to FIG. 10, the chip tray kit 1 can include a tray 11 and twenty four chip fixing members 12. The tray 11 includes twenty four tray thru-holes 111, and each of the tray thru-holes 111 penetrates through the tray 11. The quantity, the structure, and the arrangement of the tray thru-holes 111 included by the tray 11 are not limited to those shown in FIG. 3, FIG. 5, and FIG. 10. The quantity of the chip fixing members 12 corresponds to the quantity of the tray thru-holes 111. Each of the chip fixing members 12 is detachably fixed to the tray 11, and the chip fixing members 12 are correspondingly fixed in the tray thru-holes 111.

In a practical application, the chip tray kit 1 can further include a plurality of auxiliary fixing members 13, part of the auxiliary fixing members 13 are detachably fixed (e.g., in cooperation with a least one screw) to a side surface of the tray 11, and another part of the auxiliary fixing members 13 are detachably fixed to another side surface of the tray 11. In FIG. 5 and FIG. 6 of the present disclosure, each of the chip fixing members 12 can be fixed to the tray 11 through ten of the auxiliary fixing members 13, the two side surfaces of the tray 11 opposite to each other respectively have four auxiliary fixing members 13 and six auxiliary fixing members 13 disposed thereon, and the chip fixing member 12 can be fixed in the tray thru-hole 111 through the ten auxiliary fixing members 13. The structure and quantity of the auxiliary fixing members 13 used to fix one of the chip fixing members 12 to the tray 1 are limited to those shown in FIG. 5, and FIG. 6.

Referring to FIG. 7 to FIG. 10, each of the chip fixing members 12 includes sixteen fixing thru-holes 121, sixteen chip accommodating slots 122, and a plurality of limiting structures 123. The quantity of the fixing thru-holes 121, the quantity of the chip accommodating slots 122, and the quantity of the limiting structures 123 of each of the chip fixing members 12 are not limited to those shown in FIG. 7 to FIG. 10. In each of the chip fixing members 12, each of the fixing thru-holes 121 penetrates through the chip fixing member 12, the chip accommodating slots 122 are in spatial communication with the fixing thru-holes 121, and each of the chip accommodating slots 122 is configured to carry one of the chips C under test. A plurality of electrical contacting portions (not shown, such as various types of pins) of the chips C disposed in the chip accommodating slots 122 are exposed from the chip fixing member 12, and the electrical contacting portions are configured to be connected to the probe sockets 23, so that the testing machine 2 (as shown in FIG. 3) can be electrically connected to the chips C.

Each of the limiting structures 123 is formed by a plurality of side walls forming the corresponding one of the chip accommodating slots 122 that extends toward the chip accommodating slot 122. The limiting structures 123 in the same chip accommodating slot 122 are configured to jointly limit a movement range of the chip C in the chip accommodating slot 122 to prevent the chip C in the chip accommodating slot 122 from leaving the chip accommodating slot 122. In the present embodiment, the chip C in the accommodating slot 122 is limited by four limiting structures 123, but the quantity, the position, and the structure of the limiting structures 123 are not limited to those shown in FIG. 7 to FIG. 10. Naturally, the limiting structures 123 do not prevent the chip C in the accommodating slot 122 from being electrically connected to the probe sockets 23 of the testing machine 2.

Figure 9:
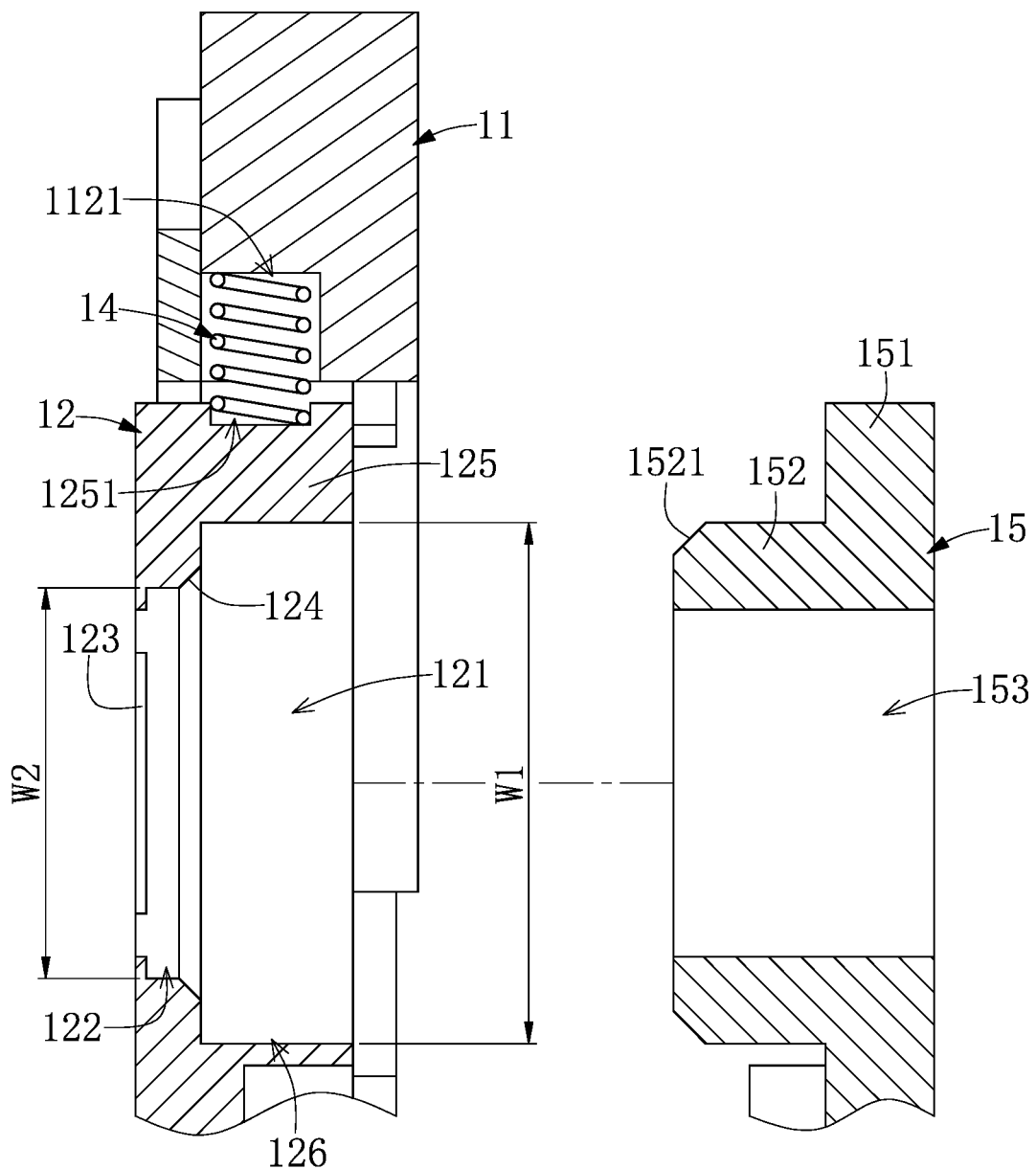
FIG. 9 is a partial sectional exploded view of the chip tray kit of the present disclosure.

Referring to FIG. 9, in a practical application, each of the chip fixing members 12 can include a guide structure 124 therein, and the guide structure 124 can be an inclined surface that is inclined toward to the chip accommodating slot 122. Through the design of the guide structure 124, in a process where the chip C is disposed into the chip accommodating slot 122 through the fixing thru-hole 121, even if a placement position of the chip C is slightly deviated, the chip C can still be guided by the guide structure 124 to be successfully disposed into the chip accommodating slot 122.

According to the above, since the chip fixing members 12 are detachably fixed to the tray 11, a user can selectively change the chip accommodating slots 122 and the fixing thru-holes 121 having different structures and dimensions of the chip fixing members 12 according to the type, the structure, and the dimension of the chips C under test.

Figure 8:
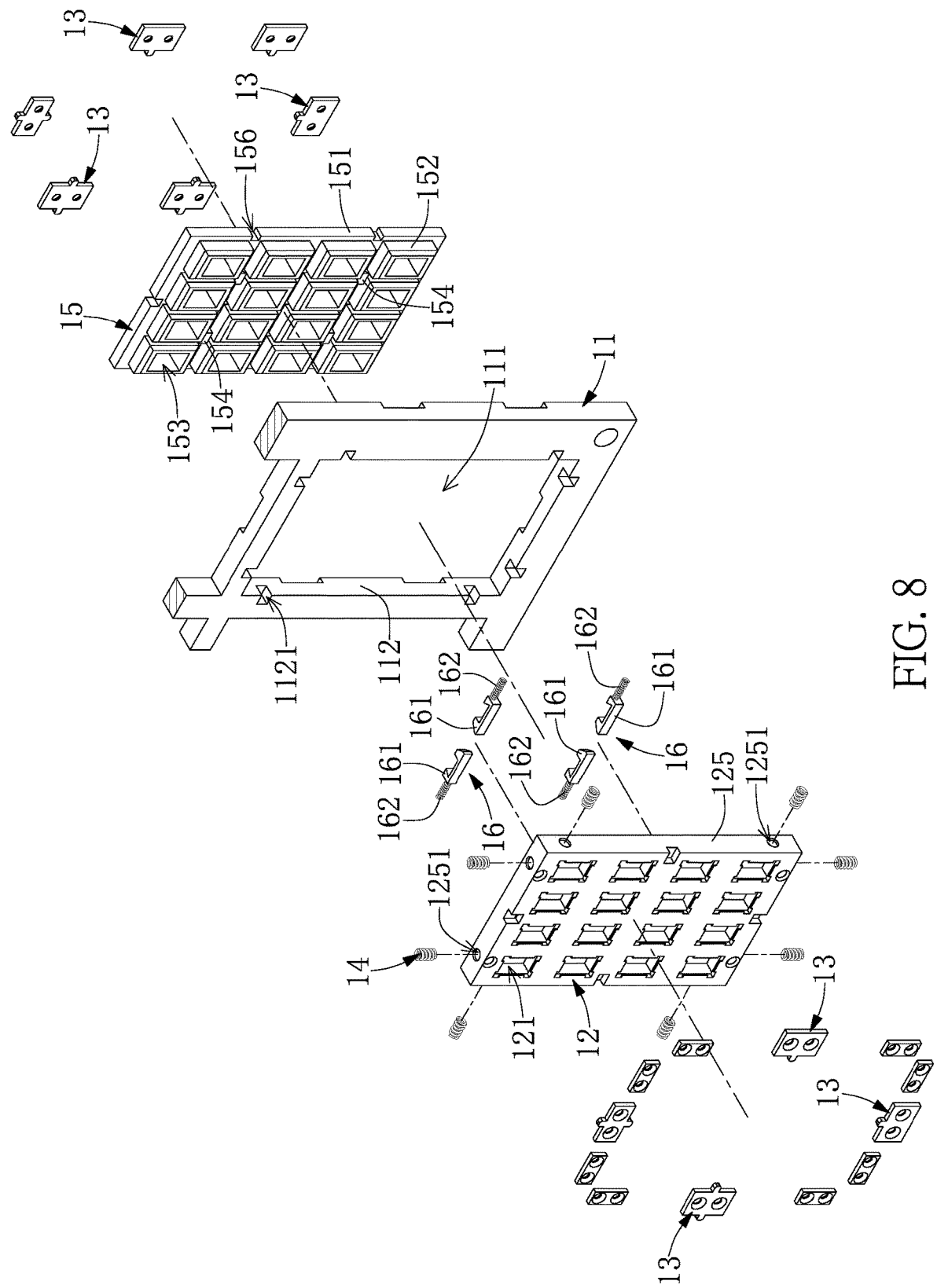

Referring to FIG. 7 and FIG. 8, in a preferable application, the chip tray kit 1 can further include a plurality of elastic members 14. One end of each of the elastic members 14 is fixed to a first accommodating slot 1121 of a plurality of side walls 112 forming each of the tray thru-holes 111, and another end of each of the elastic members 14 is correspondingly disposed in a second accommodating slot 1251 of a plurality of side walls 125 of the chip fixing member 12. In an embodiment of the present disclosure, each of the chip fixing members 12 is substantially in a rectangular structure, and at least one of the elastic members 14 can be disposed between each of the side walls 125 of the chip fixing member 12 and each of the side walls 112 forming the tray thru-hole 111.

When the chip fixing members 12 are fixed to the tray thru-holes 111, each of the elastic members 14 is in a pressed state, and an elastic force generated by each of the elastic members 14 being pressed pushes the chip fixing member 12. Therefore, the chip fixing members 12 can be stably disposed in the tray thru-holes 111. The elastic members 14 are disposed between the side walls 125 of the chip fixing members 12 and the side walls 112 forming the tray thru-holes 111, and the auxiliary fixing members 13 are fixed on two opposite wide surfaces of the tray 11. Therefore, when the auxiliary fixing members 13 are detached from the tray 11 by a user, the chip fixing members 12 can still remain disposed on the tray 11 due to the elastic members 14 pushing the chip fixing members 12, thereby preventing the chip fixing members 12 from falling off when the auxiliary fixing members 13 are detached from the tray 11. In addition, through the arrangement of the elastic members 14, when the chip tray kit 1 is fixed to one side of the testing machine 2 (as shown in FIG. 1), the chip fixing members 12 move slightly relative to the tray 11. Therefore, the chips C carried by the chip fixing members 12 can be easily connected to the probe sockets 23 (as shown in FIG. 2) of the testing machine 2.

Referring to FIG. 3 and FIG. 7 to FIG. 11, the chip tray kit 1 can further include twenty four auxiliary insertion members 15. The quantity of the auxiliary insertion members 15 is corresponding to the quantity of the chip fixing members 12, but the quantity of the auxiliary insertion members 15 is not limited to that shown in FIG. 3 and FIG. 7 to FIG. 11. Each of the auxiliary insertion members 15 is detachably disposed on one side of the corresponding one of the chip fixing members 12.

Each of the auxiliary insertion members 15 includes a main body 151 and a plurality of protrusions 152. Each of the protrusions 152 protrudes from one side of the main body 151, and the quantity of the protrusions 152 corresponds to the quantity of the fixing thru-holes 121 of each of the chip fixing members 12. Each of the chip fixing members 12 can further include a plurality of accommodating recesses 126, and each of the accommodating recesses 126 is in spatial communication with the corresponding one of the chip accommodating slots 122. A diameter W1 of the accommodating recess 126 is greater than a diameter W2 of the chip accommodating slot 122, and the accommodating recesses 126 are configured to accommodate the protrusions 152 of the auxiliary insertion members 15.

Figure 18:
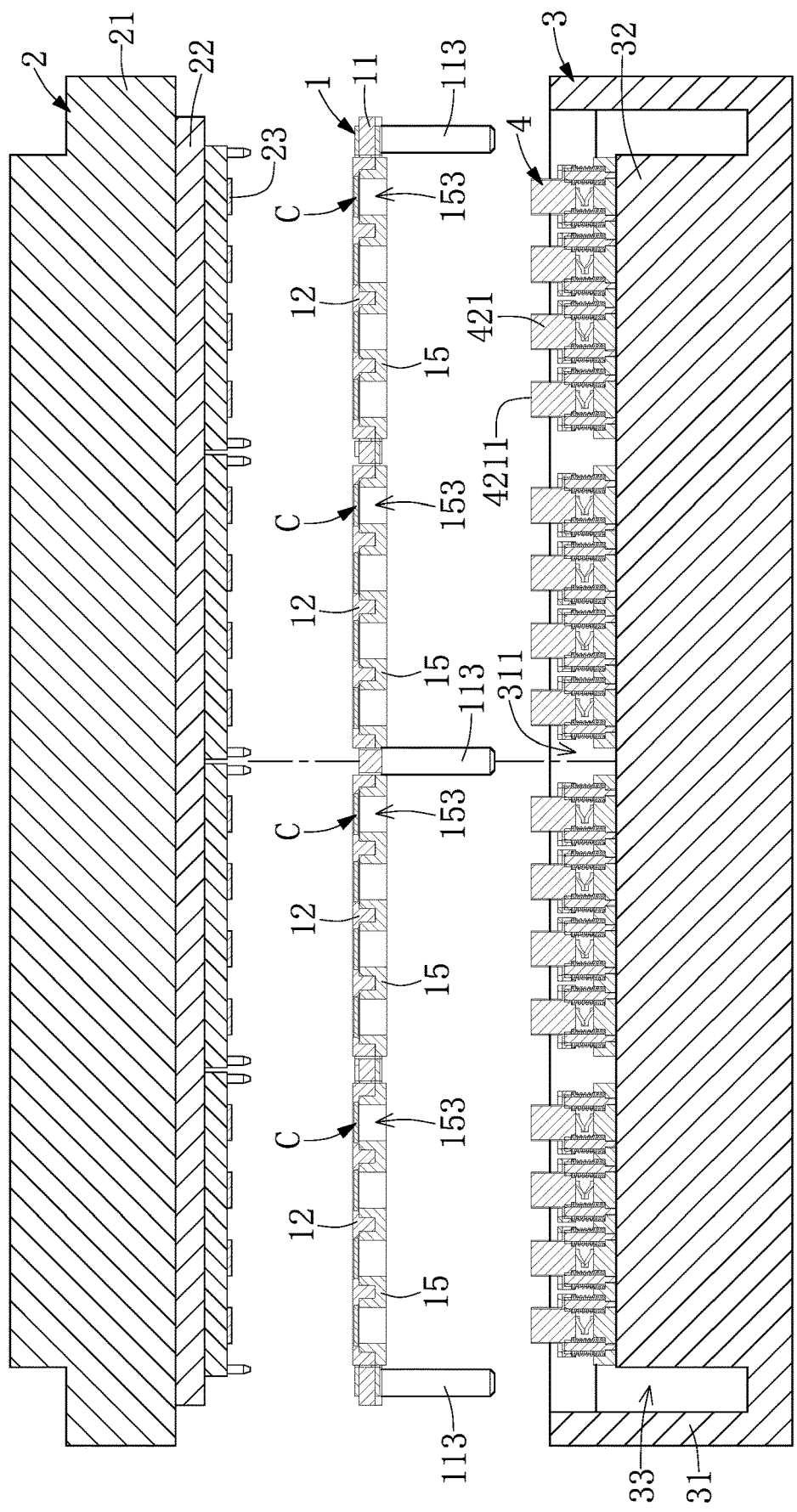
FIG. 18 is a sectional view showing a lid separated from the chip tray kit according to the present disclosure.
Figure 19:
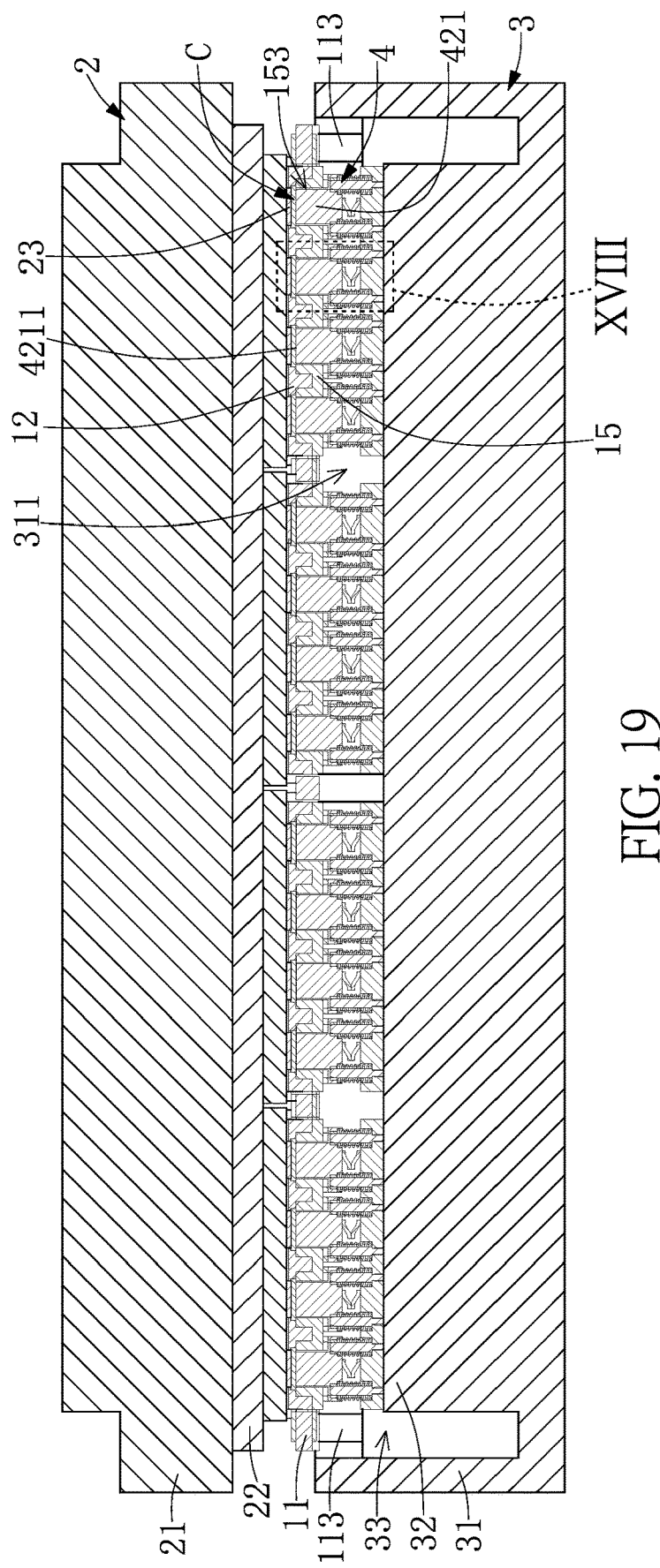
FIG. 19 is a sectional view showing the lid assembled with the chip tray kit according to the present disclosure.

Each of the auxiliary insertion members 15 includes an insertion thru-hole 153 penetrating through the main body 151 and the protrusions 152. A diameter W3 of the insertion thru-hole 153 is greater than an outer diameter W4 of a contacting portion 421 of a pressing member 42 (as shown in FIG. 14 and will be described as follows), and a portion of the contacting portion 421 is configured to penetrate through the insertion thru-hole 153 and is exposed from a side of the auxiliary insertion member 15 (as shown in FIG. 18) The diameter W3 of the insertion thru-hole 153 is less than the diameter W2 of the chip accommodating slot 122. A height of the protrusion 152 is substantially equal to a depth of the accommodating recess 126. When the protrusion 152 is arranged in the accommodating recess 126, the main body 151 of the auxiliary insertion member 15 correspondingly abuts against a top surface 128 (as shown in FIG. 10) of the chip fixing member 12.

Referring to FIG. 9, each of the protrusions 152 can include a plurality of guide inclined surfaces 1521 to allow the protrusion 152 to swiftly and correctly enter the fixing thru-hole 121. The guide inclined surfaces 1521 are configured to enable the protrusion 152 to enter the fixing thru-hole 121 more easily. Referring to FIG. 10, in a practical application, when the chip C is disposed in the chip accommodating slot 122 and the protrusion 152 is arranged in the accommodating recess 126, a gap G is formed between t the protrusion 152 and a surface C1 of the chip C, and the protrusion 152 is not in contact with the surface C1 of the chip C. When the chip fixing members 12 and the auxiliary insertion members 15 are fixed to the tray 11, the chips C disposed in the chip accommodating slots 122 of the chip fixing members 12 are jointly limited by the chip fixing members 12 and the auxiliary insertion members 15, such that it is difficult for the chips C to be detached from the chip fixing members 12.

The present disclosure does not limit the manner in which each of the auxiliary insertion members 15 is detachably disposed on one side of the corresponding one of the chip fixing members 12. Any manner that can allow each of the auxiliary insertion members 15 to be detachably disposed on one side of the corresponding one of the chip fixing members 12 falls within the scope of the present disclosure. For example, in one embodiment of the present disclosure, each of the auxiliary insertion members 15 and each of the chip fixing members 12 can be disposed in the tray thru-hole 111 of the tray 11 together, and the auxiliary fixing members 13 mentioned above can limit a movement range of each of the auxiliary insertion members 15 and each of the chip fixing members 12 relative to the tray 11. In other words, each of the auxiliary insertion members 15 and each of the chip fixing members 12 are fixed in the tray thru-hole 111 of the tray 11 through the auxiliary fixing members 13.

According to the above, as shown in FIG. 3, FIG. 7, FIG. 8, and FIG. 11 to FIG. 14, in a preferable embodiment, the chip tray kit 1 can further include a plurality of quick release assemblies 16. At least one of the quick release assemblies 16 is arranged between each of the auxiliary insertion members 15 and the corresponding one of the chip fixing members 12, and each of the auxiliary insertion members 15 can be quickly mounted to or detached from one side of the chip fixing member 12 through the at least one of the quick release assemblies 16. For example, in each of the chip fixing members 12, two of the quick release assemblies 16 can be disposed on the chip fixing member 12, and each of the quick release assemblies 16 can include two limiting members 161 and two elastic members 162. Each of the chip fixing members 12 can further include a recess 127, one end of each of the two elastic members 162 is fixed to a side wall forming the recess 127, another end of each of the two elastic members 162 is fixed to one of the limiting members 161, and the two limiting members 161 of each of the quick release assemblies 16 are disposed in one of the recesses 127.

Each of the limiting members 161 can be pushed to move in the corresponding one of the recesses 127 to correspondingly press the elastic member 162 connected thereto, and the pressed elastic member 162 correspondingly generates an elastic returning force. When the limiting member 161 is no longer pushed, the elastic returning force generated by the elastic member 162 being pressed allows the limiting member 161 to return to a position where the limiting member 161 is not pushed. When the two limiting members 161 are disposed in the recess 127, a gap P is formed between the two limiting members 161.

Each of the limiting members 161 can include an engaging slot 1611, each of the engaging slots 1611 separates the limiting members 161 into a pushing portion 16A and an engaging portion 16B, the pushing portion 16A has a guide inclined surface 16A1 at an end thereof opposite to the elastic member 162, and the engaging portion 16B has an engaging inclined surface 16B1 at an end thereof facing toward the pushing portion 16A.

Referring to FIG. 12, each of the auxiliary insertion members 15 can have a thru-hole 155 formed thereon and can have two engaging members 154 disposed thereon, the two engaging members 154 are arranged at two ends of the thru-hole 155, and each of the engaging members 154 has an engaging inclined surface 1541 at an end thereof opposite to the thru-hole 155. The thru-hole 155 of each of the auxiliary insertion members 15 is configured to allow an insertion member R to insert therein. The insertion member R is configured to push the two limiting members 161 disposed on the chip fixing member 12. In a practical application, the insertion member R can be fixed to a related robotic arm configured to fix the auxiliary insertion member 15 to the chip fixing member 12.

Referring to FIG. 12 and FIG. 13, a process where the auxiliary insertion member 15 is in cooperation with the insertion member R and is fixed to the chip fixing member 12 can be exemplified as follows. Firstly, the insertion member R penetrates through the thru-hole 155 of the auxiliary insertion member 15 and enters into the gap P between the two limiting members 161. Since the outer diameter W4 of the insertion member R is greater than a width of the gap P, when the insertion member R enters the recess 127, the insertion member R pushes the pushing portions 16A of the two limiting members 161, and each of the limiting members 161 moves accordingly toward the corresponding one of the elastic members 162, such that each of the elastic members 162 is pressed and elastically deformed.

According to the above, as shown in FIG. 13, when an end of the insertion member R abuts against a bottom portion forming the recess 127, each of the engaging members 154 is disposed in the engaging slot 1611 of the corresponding one of the limiting members 161, the engaging inclined surface 1541 of each of the engaging members 154 faces toward the engaging inclined surface 16B1 of the engaging portion 16B of the adjacent limiting member 161, and each of the engaging inclined surfaces 1541 is not in contact with the adjacent engaging inclined surface 16B1. Afterwards, as shown in FIG. 14, when the insertion member R is removed from the recess 127, the elastic returning forces generated by the two elastic members 162 in the recess 127 being pressed allow the two limiting members 161 to move toward each other. Finally, the engaging inclined surface 16B1 of the engaging portion 16B of each of the limiting members 161 abuts against the engaging inclined surface 1541 of the adjacent engaging member 154, and the auxiliary insertion member 15 is accordingly engaged with and fixed to the chip fixing member 12.

Referring to FIG. 14, when the auxiliary insertion member 15 is fixed to the chip fixing member 12 through the engaging members 154 and the quick release members 16, a structure (e.g., a related robotic arm) can allow the insertion member R to penetrate through the thru-hole 155 of the auxiliary insertion member 15 and enter into the gap P between the two limiting members 161 to push the two limiting members 161. At this time, the two limiting members 161 change from a state shown in FIG. 14 to a state shown in FIG. 13. In the state shown in FIG. 13, the engaging inclined surface 16B1 of each of the limiting members 161 is no longer in contact with the engaging inclined surface 1541 of the adjacent engaging member 154. The structure (e.g., the related robotic arm) can hold the auxiliary insertion member 15 and pull out the auxiliary insertion member 15 in a direction away from the chip fixing member 12, so as to separate the auxiliary insertion member 15 and the chip fixing member 12.

Referring to FIG. 5 and FIG. 7, it is worth mentioning that in an embodiment of the present disclosure, each of the auxiliary insertion members 15 is fixed to the chip fixing member 12 through the quick release assemblies 16, and each of the auxiliary insertion members 15 can have a plurality of avoidance holes 156 formed thereon. Each of the avoidance holes 156 is configured to avoid the auxiliary fixing member 13, so that the auxiliary fixing members 13 do not limit the movement range of the auxiliary insertion member 15.

Figure 15:
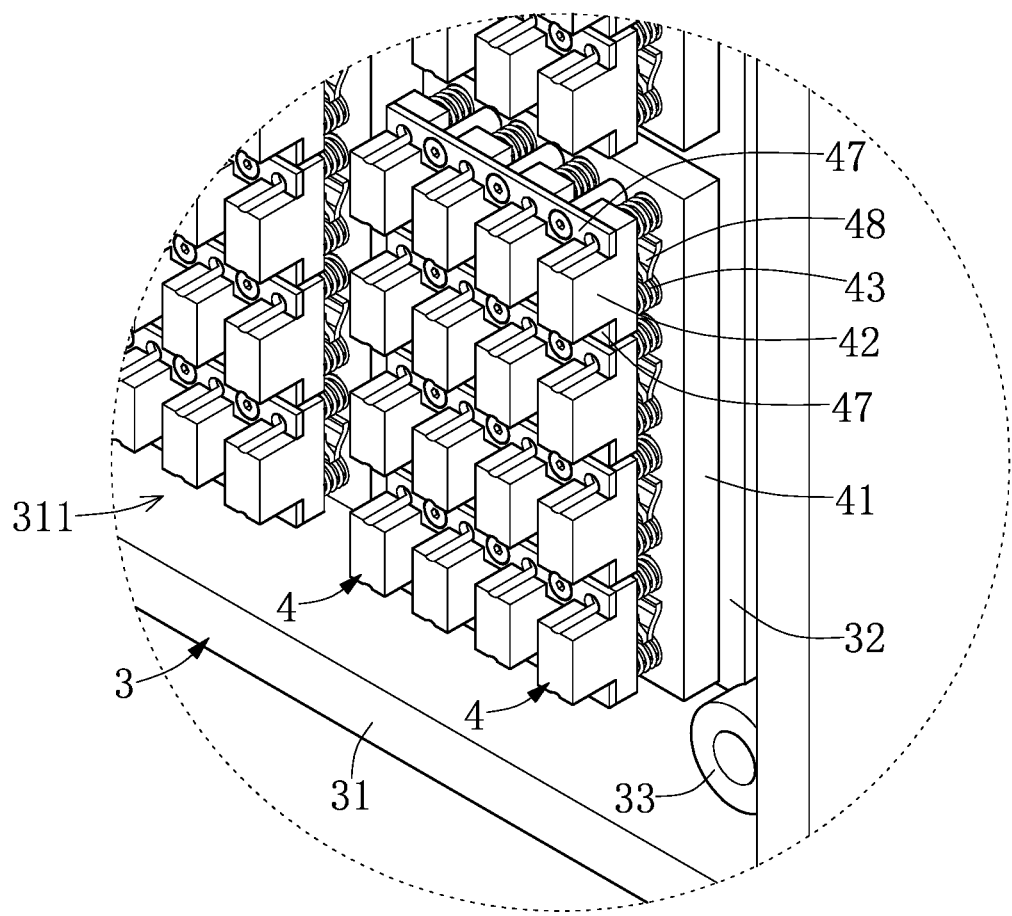
FIG. 15 is a partial enlarged view of FIG. 3.

Referring to FIG. 15 and FIG. 18, the lid 3 can include a main body 31 and a conduction structure 32, one side of the main body 31 is recessed to form an accommodating slot 311, the conduction structure 32 forms on one side of the main body 31, and the conduction structure 32 is arranged in the accommodating slot 311. The pressing assemblies 4 are disposed on the lid 3, and each of the pressing assemblies 4 is arranged in the accommodating slot 311 of the lid 3. It should be noted that in FIG. 17 of the present embodiment, the pressing assemblies 4 protrude from one end of the lid 3, but the present disclosure is not limited thereto. In other embodiments, the pressing assemblies 4 can be provided without protruding from the lid 3, and the pressing assemblies 4 are completely arranged in the accommodating slot 311 of the lid 3. In other words, a sum of a thickness of the conduction structure 32 and a height of each of the pressing assemblies 4 can be greater than, equal to, or less than a depth of the accommodating slot 311 of the lid 3.

The lid 3 is configured to cover a side of the tray 11. When the lid 3 covers the side of the tray 11, the pressing assemblies 4 disposed on the lid 3 correspondingly press the surfaces C1 (as shown in FIG. 18) of the chips C in the chip fixing members 12 disposed on the tray 11. In other embodiments, when the lid 3 covers the side of the tray 11, the pressing assemblies 4 can be not in contact with the chips C. It is not until air in an enclosed space jointly defined by the lid 3 and the tray 11 is suctioned away that the pressing assemblies 4 press the surfaces C1 of the chips C. The dimension and the structure of the lid 3 and the quantity of the pressing assemblies 4 disposed on the conduction structure 32 of the lid 3 are not limited to those shown in FIG. 15 and FIG. 18.

In a practical application, the lid 3 and the tray 11 can respectively include a plurality of guide structures 33 and a plurality of guide structures 113 that are configured to be engaged with each other. For example, each of the guide structures 33 of the lid 3 can include a blind hole, and each of the guide structures 113 of the tray 11 can be a column structure. When the lid 3 covers the side of the tray 11, the column structures of the tray 11 would be engaged with the blind holes of the lid 3. Through the design of the guide structures 33 of the lid 3 and the guide structures 113 of the tray 11, the lid 3 can swiftly and correctly cover the side of the tray 11, so that each of the pressing assemblies 4 can be swiftly and correctly arranged on one side of the corresponding one of the chips C in the chip accommodating slot 122. The quantity and structure of the guide structures 33 of the lid 3 and the guide structures 113 of the tray 11 are not limited to those shown in FIG. 15 and FIG. 18.

Figure 16:
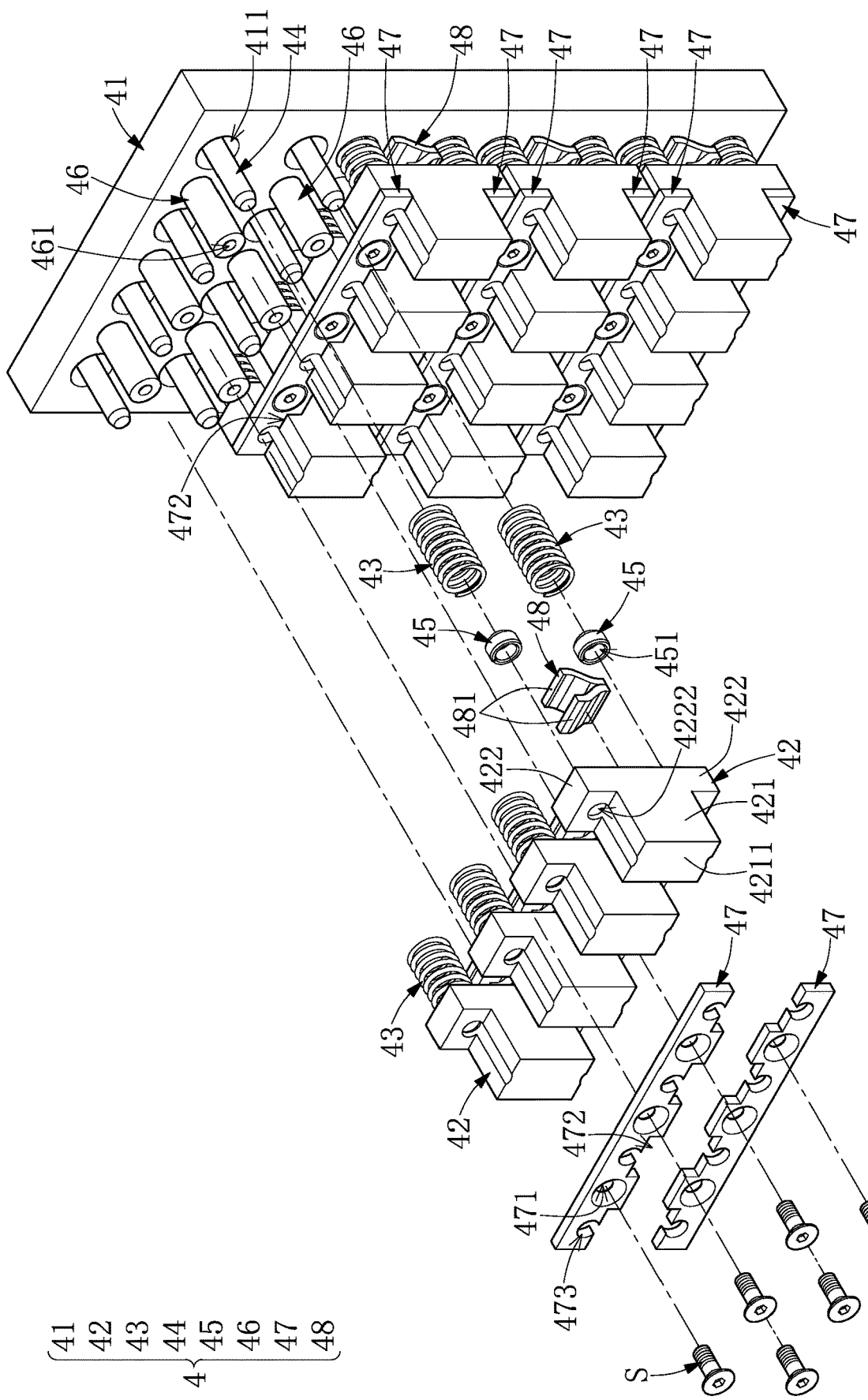
FIG. 16 is a partial exploded view of a pressing assembly of the present disclosure.
Figure 17:
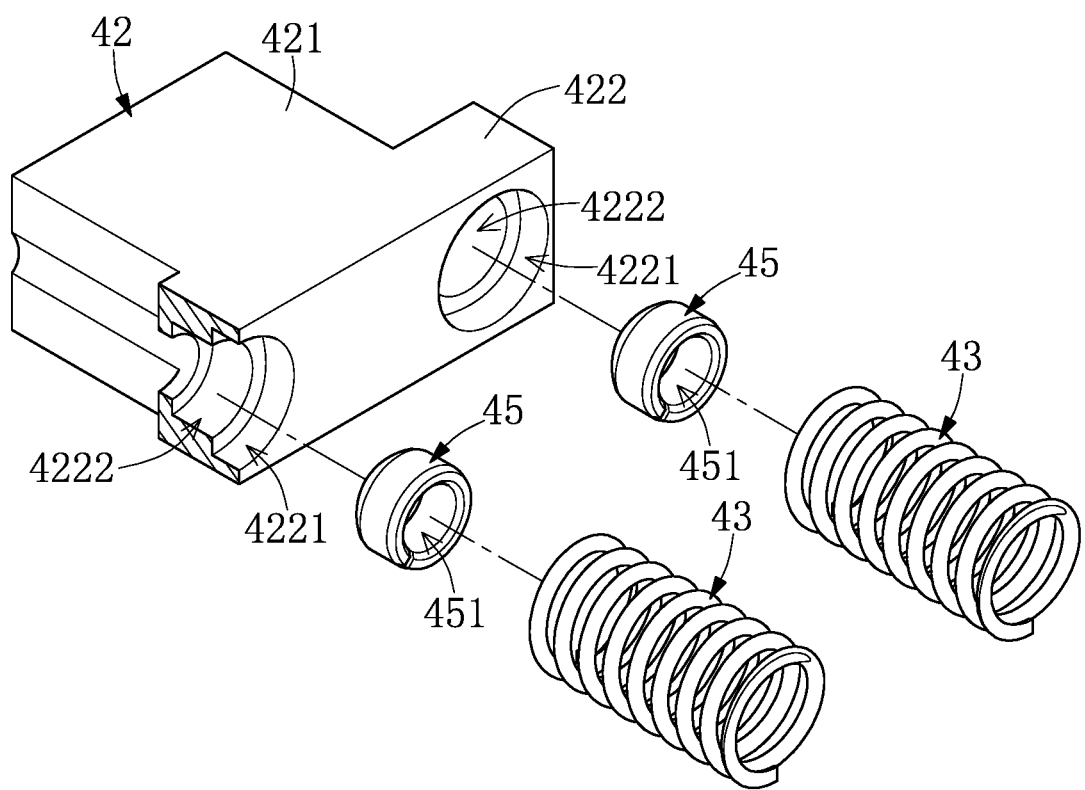
FIG. 17 is a partial exploded view of the pressing assembly of the present disclosure.

Referring to FIG. 15 to FIG. 17, each of the pressing assemblies 4 includes a base seat 4, the pressing member 42, and two elastic members 43. In the present embodiment, sixteen pressing assemblies 4 share one of the base seats 41, but the present disclosure is not limited thereto. In other embodiments, the pressing assemblies 4 can be provided without sharing the same base seat 41. The base seats 41 can be detachably fixed to the conduction structure 32 of the lid 3. In other embodiments, the base seats 41 and the conduction structure 32 can be a one-piece structure. In an embodiment of the present disclosure, the base seats 41 are detachably fixed to the lid 3, and the pressing assemblies 4 can be easily changed and maintained by a technical personnel.

Each of the pressing members 42 includes the contacting portion 421 and an abutting portion 422. The contacting portion 421 includes a contacting surface 4211, the outer diameter W4 of the contacting portion 421 is less than the diameter W3 (as shown in FIG. 10) of the insertion thru-hole 153, a portion of the contacting portion 421 is configured to extend into the thru-hole 153 (as shown in FIG. 10), and the contacting surface 4211 is configured to press the surface C1 of the chip C. Primarily, the contacting portions 421 are configured to press the surfaces C1 of the chips C, so that the chips C can be stably connected to the testing machine 2 (as shown in FIG. 3). Therefore, when the chips C are tested by the testing machine 2, an issue of the chips C separating from the probe sockets 23 (as shown in FIG. 5) can be avoided.

Figure 20:
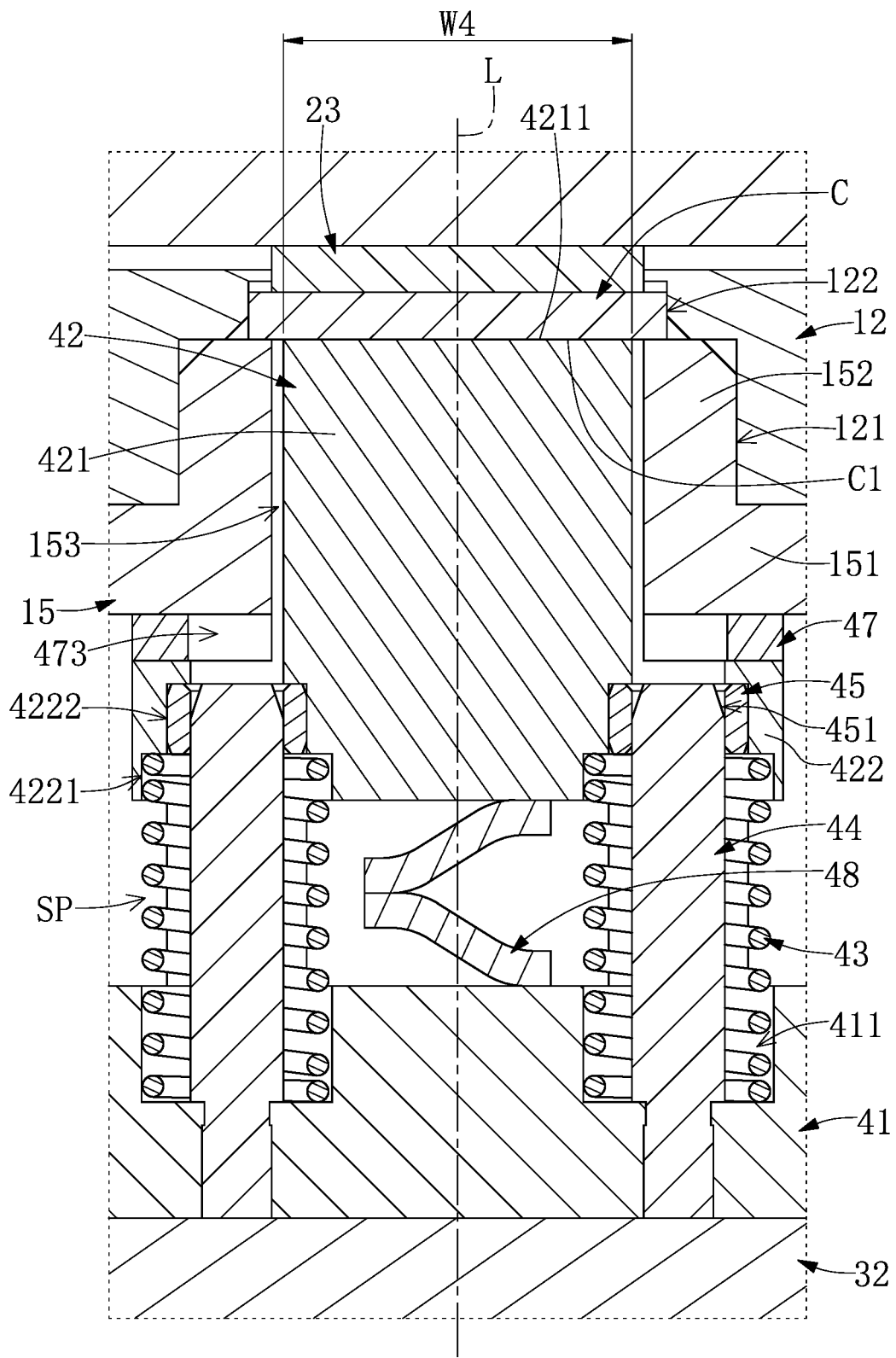
FIG. 20 is a partial enlarged view of FIG. 19.

In each of the pressing members 42, the abutting portion 422 is connected to the contacting portion 421, and the abutting portion 422 is configured to limit a movement range of the pressing member 42 relative to the auxiliary insertion member 15, so as to prevent the contacting portion 421 from overly pressing on the chip C. As shown in FIG. 20, when the lid 3 covers the side of the tray 11, the abutting portion 422 of each of the pressing members 42 is arranged at one side of the auxiliary insertion member 15, the contacting portion 421 of the pressing member 42 is correspondingly arranged in the insertion thru-hole 153, and the contacting surface 4211 is correspondingly arranged at one side of the surface C1 of the chip C.

Two ends of each of the elastic members 43 are fixed to one of the base seats 41 and one of the pressing members 42. When the contacting surface 4211 of one of the pressing members 42 is in contact with the surface C1 of the chip C and the surface C1 is uneven, at least one of the elastic members 43 is in a pressed state, and the elastic returning force generated by the elastic member 43 being pressed allows the contacting surface 4211 to be tightly in contact with the surface C1 of the chip C. The quantity of the elastic member 43 included in each of the pressing assemblies 4 is not limited to two. In other embodiments, each of the pressing assemblies 4 can include one elastic member 43 or at least three elastic members 43.

As shown in FIG. 16 and FIG. 17, in a practical application, the elastic member 43 can be a compression spring. Each of the pressing assemblies 4 can include two compression springs (i.e., the elastic members 43), and each of the pressing assemblies 4 can further include two guide members 44 and two fixing kits 45. The abutting portion 422 of the pressing member 42 can include two first recesses 4221, each of the base seats 41 can include two second recesses 411, each of the first recesses 4221 faces toward one of the second recesses 411, and two ends of each of the compression springs are respectively engaged with one of the first recesses 4221 and one of the second recesses 411.

The abutting portion 422 of each of the pressing members 42 can further include two penetrating holes 4222, each of the penetrating holes 4222 is in spatial communication with the corresponding one of the first recesses 4221, the two fixing kits 45 are fixed in the two penetrating holes 4222, each of the fixing kits 45 includes a penetrating hole 451, one end of each of the guide members 44 is fixed to one of the base seats 41, and another end of each of the guide members 44 penetrates through the penetrating hole 451 of the corresponding one of the fixing kits 45. When each of the pressing members 42 moves relative to the base seat 41, each of the fixing kits 45 can move relative to the corresponding one of the guide members 44, and the two guide members 44 and the two fixing kits 45 can jointly limit a movement direction of each of the pressing members 42 relative to the base seat 41. Through the design of the two guide members 44 and the two fixing kits 45, each of the pressing members 42 can be effectively limited to substantially move in a direction perpendicular to an axis L (as shown in FIG. 18) of a surface of the base seat 41. Therefore, when each of the pressing members 42 presses the surface C1 of the chip C, the contacting portion 421 of the pressing member 42 would be in contact with the surface C1 of the chip C through the overall contacting surface 4211.

As shown in FIG. 16, each of the pressing assemblies 4 can further include at least one fixing structure 46 and at least one limiting member 47. The limiting member 47 is detachably fixed to the fixing structure 46, a portion of the limiting member 47 abuts against the abutting portions 422 of the pressing members 42, and the limiting member 47 and the fixing structure 46 are configured to jointly limit the movement range of the pressing members 42 relative to the base seat 41. For example, each of the base seats 41 can include twenty four fixing structures 46, every four of the twenty four fixing members 46 are arranged in a row and disposed on the base seat 41, every six of the fixing structures 46 and two of the limiting members 47 jointly limit four of the pressing members 42, and twenty four of the fixing structures 46 are in cooperation with eight of the limiting members 47, so that sixteen of the pressing members 42 are disposed on the base seat 41. Each of the fixing structures 46 can include a screwing hole 461, each of the limiting members 47 includes three thru-holes 471, and three screws S can be in cooperation with three of the fixing structures 46 and the three thru-holes 471 of one of the limiting members 47, so that one of the limiting members 47 is fixed to three of the fixing structures 46, and one of the limiting members 47 correspondingly presses the abutting portions 422 of four of the pressing members 42.

In a practical application, each of the limiting members 47 can further include an accommodating notch 472 configured to accommodate a portion of the contacting portion 421. In FIG. 16 of the present embodiment, one of the limiting members 47 abuts against the abutting portions 422 of four of the limiting members 4 at the same time. Therefore, the limiting member 47 can correspondingly include four accommodating notches 472, and each of the four accommodating notches 472 correspondingly accommodates a portion of the contacting portion 421 of the four limiting members 47. Through the design of the accommodating notches 472, the movement direction of each of the pressing members 42 relative to the base seat 41 can be auxiliarily limited, and each of the pressing members 42 substantially moves in the direction perpendicular to the axis L (as shown in FIG. 18) of the base seat 41.

In an embodiment of the present disclosure, each of the pressing assemblies 4 has the guide members 44, each of the limiting members 47 can correspondingly include at least one avoidance thru-hole 473, and each of the avoidance thru-holes 473 is configured to be penetrated by one of the guide members 44. In other words, when each of the pressing members 42 moves toward one of the base seats 41, a portion of each of the guide members 44 penetrates through one of the avoidance thru-holes 473. The structure of the avoidance thru-holes 473 is not limited to that shown in FIG. 16.

Referring to FIG. 3, and FIG. 15, the temperature adjusting device 5 can be connected to the pressing assemblies 4 through the lid 3. The temperature adjusting device 5 is configured to allow a temperature of each of the pressing members 42 to reach a predetermined temperature. Through the temperature adjusting device 5, when the chips C disposed on the chip fixing members 12 are connected to the testing machine 2 and tested by the testing machine 2, the pressing members 42 reaching the predetermined temperature press the surfaces C1 (as shown in FIG. 8) of the chips C (as shown in FIG. 8). In this way, the chips C can be tested in an environment having the predetermined temperature. In a preferable embodiment, each of the pressing members 42 can be made of a metal material having a high thermal conductivity.

In a conventional chip testing operation, a plurality of chips are disposed and tested in a huge freezer or an oven. Since the temperatures of different areas in the freezer or the oven are not exactly the same, the chip testing operation cannot be performed to the chips under the same temperature.

Therefore, a testing result is not reliable. In contrast, in the burn-in apparatus D7, the low temperature testing module D82, and the high temperature testing module D83 of the present disclosure, when the chips C are tested by the testing machine 2, the contacting surface 4211 (as shown in FIG. 14) of each of the pressing members 42 reaching the predetermined temperature can allow the testing machine 2 to press the surface C1 (as shown in FIG. 8) of the chip C (as shown in FIG. 8). Therefore, the chips C can be tested substantially under the same temperature.

In a practical application, the temperature adjusting device 5 can allow the temperature of each of the pressing members 42 to reach the predetermined temperature in any manner according to practical requirements, and the present disclosure is not limited thereto. For example, the temperature adjusting device 5 can be connected to the conduction structure 32 of the lid 3, each of the base seats 41 is fixed to the conduction structure 32, the temperature adjusting device 5 can allow a temperature of the conduction structure 32 to increase or decrease, and the conduction structure 32 and the pressing members 42 can mutually transfer heat through the base seats 41 and the elastic members 43, so that the temperature of each of the pressing members 42 reaches the predetermined temperature. The conduction structure 32 mentioned herein is a structure made of a material having a high thermal conductivity. In an embodiment of the present disclosure, the main body 31 of the lid 3 and the conduction structure 32 are formed as a one-piece structure, and the temperature adjusting device 5 and the pressing assemblies 4 mutually transfer heat through the lid 3. In an embodiment of the present disclosure, the main body 31 of the lid 3 and the conduction structure 32 are not formed as a one-piece structure, and the temperature adjusting device 5 can be directly connected to the conduction structure 32.

In one embodiment of the present disclosure, the conduction structure 32 can internally include at least one fluid channel (not shown), and the temperature adjusting device 5 is configured to provide a fluid into the fluid channel, so that the temperature of the conduction structure 32 increases or decreases. The fluid can be various types of high-temperature fluids or low-temperature fluids. In one embodiment of the present disclosure, the temperature adjusting device 5 can include a temperature controller (not shown) and a heating coil (not shown), the temperature controller is electrically connected to the heating coil, the heating coil is disposed in the conduction structure 32, and the temperature controller is configured to drive the heating coil to be operated, so that the temperature of the conduction structure 32 increases. In an embodiment of the present disclosure, the temperature adjusting device 5 includes the temperature controller, the temperature adjusting device 5 can further include a cooling chip (not shown), the temperature controller is electrically connected to the cooling chip, the cooling chip is disposed in the conduction structure 32, and the temperature controller is configured to drive the cooling chip to be operated, so that the temperature of the conduction structure 32 decreases. In a practical application, both the cooling chip and the heating coil can be disposed in the conduction structure 32 at the same time, and the present disclosure is not limited thereto.

Referring to FIG. 16, each of the pressing assemblies 4 can further include a heat conduction member 48, so that the temperature of the pressing member 42 can easily reach the predetermined temperature. The heat conduction members 48 are arranged between the pressing members 42 and the base seats 41, the heat conduction members 48 are connected to the pressing members 42 and the base seat 41, and the heat conduction members 48 are configured to facilitate the heat to be transferred between the pressing members 42 and the base seat 41. Each of the heat conduction members 48 can include two elastic arms 481, and an end of one of the elastic arms 481 is connected to an end of another one of the elastic arms 481. When the pressing members 42 move toward the base seat 41, the two elastic arms 481 are pressed by the pressing members 42 and are elastically deformed. When the pressing members 42 move away from the base seat 41, an elastic returning force generated by each of the elastic arms 481 being pressed allows the elastic arm 481 to return to an unpressed state. In this way, whether the pressing members 42 are static or moving relative to the base seat 41, the heat between the pressing members 42 and the conduction structure 32 can be preferably transferred by the heat conduction member 48. It is worth mentioning that the guide members 44 and the fixing kits 45 mentioned above can be also made of a material having a high thermal conductivity, and the guide members 44 and the fixing kits 45 can be also used to facilitate the heat to be transferred between the pressing members 42, the base seat 41, and the conduction structure 32.

Referring to FIG. 3 and FIG. 19 to FIG. 21, the processing device 8 is electrically connected to the testing machine 2, the air suction device 6, and the transferring device 7, and the processing device 8 can control the testing machine 2, the air suction device 6, and the transferring device 7 to be operated. The processing device 8 can be various types of computers or servers. The transferring device 7 is connected to the lid 3, and the transferring device 7 can move the lid 3 toward or away from the tray 11. The transferring device 7 mentioned herein is primarily configured to move the lid 3 and the tray 11 toward or away from each other. Therefore, in other embodiments, the transferring device 7 can be connected to the tray 11, and the transferring device 7 can move the tray 11 toward or away from the lid 3.

As shown in FIG. 20, when the transferring device 7 moves the lid 3 toward the tray 11, the lid 3 covers one side of the tray 11, and one side of the tray 11 opposite to the lid 3 is fixed to the testing machine 2 (as shown in FIG. 3). The contacting surface 4211 of each of the pressing members 42 abuts against the surface C1 of the chip C, one side of the chip C is connected to the probe socket 23 of the testing machine 2, and the lid 3, the chip fixing member 12, the tray 11, and the chips C jointly define an enclosed space SP. At this time, the processing device 8 controls the air suction device 6 to suction air in the enclosed SP, so that the enclosed space SP is in a negative pressure state. It is worth mentioning that the burn-in apparatus D7 and the chip testing apparatus D83 can further include a detector (not shown), the detector is electrically connected to the processing device 8, the detector is configured to detect whether the lid 3 covers the side of the tray 11, and the processing device 8 controls the air suction device 6 to be operated when the processing device 8 determines that the lid 3 already covers the side of the tray 11 according to a detecting result of the detector.

Since the air suction device 6 suctions away air in the enclosed space SP, and the enclosed space SP is in the negative pressure state, the air suction device 6 can effectively prevent a temperature inside the enclosed space SP from being affected by the environment outside the enclosed space SP.

Moreover, a humidity of the enclosed space SP can also be effectively controlled, thereby effectively preventing condensation from occurring on the surface C1 of the chip C.

It is worth mentioning that since the pressing member 42 is connected to the two elastic members 43, when the contacting surface 4211 or the surface C1 of the chip C is uneven, most area of the contacting surface 4211 of the pressing member 42 can still press the surface C1 of the chip C. More specifically, when the contacting surface 4211 and the surface C1 of the chip C are in an inclined state, one of the elastic members 43 is in a pressed state, and an elastic returning force generated by the elastic member 43 being pressed allows the contacting surface 4211 to tightly press the surface C1 of the chip C.

Referring to FIG. 10 and FIG. 20, the diameter W3 of the insertion hole 153 of each of the auxiliary insertion members 15 is less than the diameter W2 of the chip accommodating slot 122. Therefore, when the enclosed space SP is converted from the negative pressure state to a normal pressure state, and the transferring device 7 moves away from the tray 11, if the chip C adheres to the pressing member 42, the chip C is pushed by an end of the protrusion 152 of the auxiliary insertion member 15 near the chip accommodating slot 122 to be separated from the contacting portion 421 when the contacting portion 421 leaves the auxiliary insertion member 15 along the thru-hole 153. In other words, since the auxiliary insertion members 15 are disposed on the tray 11, and the diameter W3 of the insertion hole 153 is less than the diameter W2 of the chip accommodating slot 122, it can be ensured that the chips C adhere to the contacting portions 421 when the lid 3 and the pressing members 4 move away from the tray 11.

When the burn-in apparatus D7 and the chip testing apparatus D8 mentioned above of the present disclosure are manufactured and sold, the burn-in apparatus D7 and the chip testing apparatus D8 can include the testing machine 2, the lid 3, the pressing assemblies 4, the temperature adjusting device 5, and the processing device 8, but the present disclosure is not limited thereto. In other embodiments, when the burn-in apparatus D7 and the chip testing apparatus D8 of the present disclosure are manufactured and sold, at least one of the chip tray kit 1, the air suction device 6, and the transferring device 7 can be further included. In addition, the chip tray kit 1 of the present disclosure can also be independently manufactured and sold.

Figure 21:
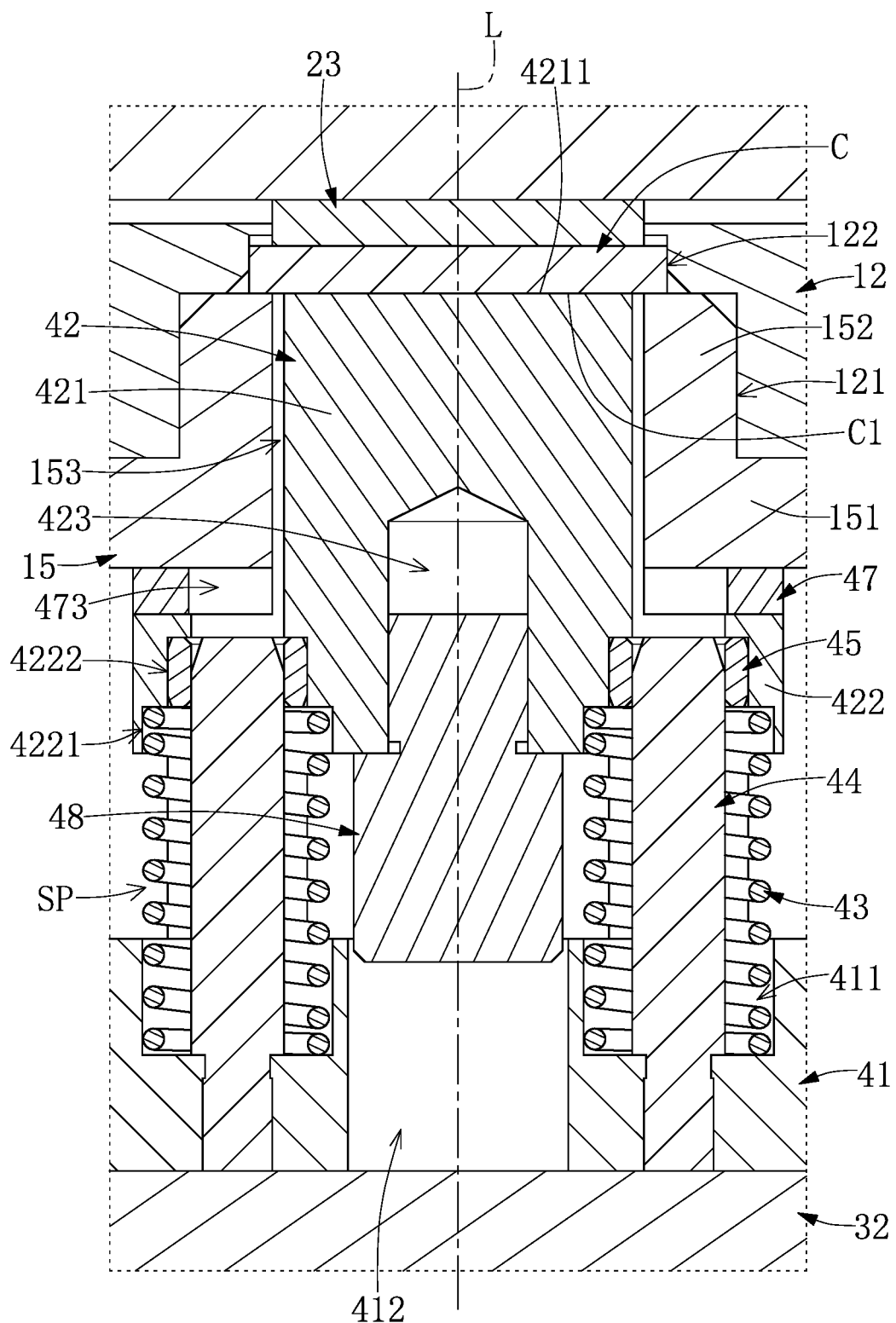
FIG. 21 is a sectional view of the pressing assembly according to another embodiment of the present disclosure.

Referring to FIG. 21, FIG. 21 is a sectional view of the pressing assembly of another embodiment of the present disclosure. The difference between the pressing assembly of the present embodiment and the pressing assembly 4 of the previous embodiments is that the heat conduction member 48 can be in a column structure, an end of the heat conduction member 48 is fixed to a recess 423 of the pressing member 42, an end of the heat conduction member 48 is movably disposed in an accommodating slot 412 of the base seat 41, and another end of the heat conduction member 48 is fixed to the pressing member 42. When the pressing member 42 moves relative to the base seat 41, the heat conduction member 48 correspondingly moves in the accommodating slot 412 of the base seat 41, the heat conduction member 48 is in contact with the side walls forming the accommodating slot 412 at any time, and the temperature adjusting device 5 and the pressing members 42 mutually transfer heat through the base seat 41 and the heat conduction member 48 in the column structure.

Beneficial Effects of the Embodiments

In conclusion, through the design of the pressing assemblies and the temperature adjusting device of the chip testing system of the present disclosure, when each of the chips is tested by the testing machine, the chip is pressed by the pressing member reaching the predetermined temperature. In this way, each of the chips can be stably connected to the testing machine and can be tested under the predetermined temperature.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip testing system, configured to perform a testing operation to a plurality of chips, comprising:
   a chip tray kit including:
   a tray having a plurality of tray thru-holes each penetrating through the tray;
   a plurality of chip fixing members detachably fixed to the tray, wherein each of the chip fixing members is arranged in the corresponding one of the tray thru-holes, each of the chip fixing members includes a plurality of fixing thru-holes and a plurality of chip accommodating slots, each of the fixing thru-holes penetrates through the chip fixing member, each of the chip accommodating slots is in spatial communication with the corresponding one of the fixing thru-holes, each of the chip accommodating slots is configured to accommodate one of the chips, and a plurality of connection portions of the chip accommodated in the corresponding one of the chip accommodating slots are fixed through the chip; and
   a plurality of auxiliary insertion members detachably fixed to a side of the chip fixing members, wherein each of the auxiliary insertion members is configured to limit a movement range of the chips in the corresponding one of the chip fixing members relative to the chip fixing member, and wherein each of the auxiliary insertion members includes a plurality of insertion thru-holes, and when each of the auxiliary insertion members is fixed to the side of the chip fixing members, each of the insertion thru-holes is in spatial communication with the corresponding one of the chip accommodating slots;
   an insertion member mounting apparatus configured to mount the auxiliary insertion members onto the side of the chip fixing members;
   a chip testing apparatus including:
   at least one testing machine configured to be connected to the chip tray kit, wherein the at least one testing machine is configured to perform the testing operation to the chips carried by the chip tray kit;
   at least one lid having an accommodating slot formed at one side thereof, wherein the at least one lid is configured to cover a side of the tray;
   a plurality of pressing assemblies disposed on the at least one lid, wherein each of the pressing assemblies is arranged in the accommodating slot of the at least one lid, and the pressing assemblies are configured to press a plurality of surfaces of the chips carried by the chip fixing members of the chip tray kit; and
   a temperature adjusting device connected to the pressing assemblies, wherein the temperature adjusting device is configured to allow a temperature of each of the pressing assemblies to reach a predetermined temperature;
   an insertion member detaching apparatus configured to detach the auxiliary insertion members from the side of the chip fixing members; and
   a conveying apparatus configured to convey the chip tray kit.

2. The chip testing system according to claim 1, wherein the chip testing apparatus includes at least four chambers, a low temperature testing module, a high temperature testing module, at least five movable doors, and an inflating device, wherein the at least four chambers are respectively defined as a preparation chamber, a low temperature chamber, a buffer chamber, and a high temperature chamber, wherein a temperature in the preparation chamber is less than a room temperature and is greater than a temperature in the low temperature chamber, the temperature in the low temperature chamber is within a range from −50° C. to 20° C., a temperature in the buffer chamber is greater than the temperature in the low temperature chamber and is less than a temperature in the high temperature chamber, and the temperature in the high temperature chamber is within a range from 25° C. to 150° C., wherein the low temperature testing module is disposed in the low temperature chamber, and the low temperature testing module is configured to be in contact with the chips carried by the chip tray kit, so that the chips are tested in a low temperature state, wherein the high temperature testing module is disposed in the high temperature chamber, and the high temperature testing module is configured to be in contact with the chips carried by the chip tray kit, so that the chips are tested in a high temperature state, wherein one of the movable doors is disposed between any two of the chambers, and the inflating device is configured to fill each of the chambers with a clean super dry air, and wherein, when any one of the movable doors is open, the inflating device fills the corresponding chamber with the super dry air.

3. The chip testing system according to claim 2, further comprising at least one burn-in apparatus, at least one major conveying machine, and at least two minor conveying machines, wherein the at least one major conveying machine is configured to convey the chip tray kit between the at least one burn-in apparatus and the chip testing apparatus, wherein the at least one burn-in apparatus is configured to perform a burn-in test to the chips carried by the chip tray kit, wherein one of the minor conveying machines is disposed between the at least one burn-in apparatus and the at least one the major conveying machine, and one of the minor conveying machines is configured to convey the chip tray kit between the at least one major conveying machine and the at least one burn-in apparatus, so that the chip tray kit is connected to the at least one burn-in apparatus or leaves the at least one burn-in apparatus, and wherein another one of the minor conveying machines is disposed between the chip testing apparatus and the at least one major conveying machine, and is configured to convey the chip tray kit between the at least one major conveying machine and the chip testing apparatus, so that the chip tray kit is connected to the chip testing apparatus or leaves the chip testing apparatus.

4. The chip testing system according to claim 3, further comprising a major chamber, an inflating apparatus, and two major movable doors, wherein the chip testing apparatus, the at least one burn-in apparatus, the at least one major conveying machine, and the at least two minor conveying machines are disposed in the major chamber, and the inflating apparatus is configured to fill the major chamber with a clean super dry air, and wherein the major chamber includes an inlet and an outlet, one of the major movable doors is disposed at the inlet of the major chamber, and another one of the major movable doors is disposed at the outlet of the major chamber.

5. The chip testing system according to claim 1, wherein the chip testing apparatus includes at least three chambers, a low temperature testing module, at least three movable doors, and an inflating device, wherein the at least three chambers are respectively defined as a preparation chamber, a low temperature chamber, and a buffer chamber, wherein a temperature in the preparation chamber is less than a room temperature and is greater than a temperature in the low temperature chamber, the temperature in the low temperature chamber is within a range from −50° C. to 20° C., and a temperature in the buffer chamber is greater than the temperature in the low temperature chamber and is less than 25° C., wherein the low temperature testing module is disposed in the low temperature chamber, and the low temperature testing module is configured to be in contact with the chips carried by the chip tray kit, so that the chips are tested in a low temperature state, wherein one of the movable doors is disposed between any two of the chambers, and the inflating device is configured to fill each of the chambers with a clean super dry air, and wherein, when any one of the movable doors is open, the inflating device fills the corresponding chamber with the super dry air.

6. The chip testing system according to claim 1, wherein the chip testing apparatus includes at least three chambers, a high temperature testing module, at least three movable doors, and an inflating device, wherein the at least three chambers are respectively defined as a buffer chamber, a high temperature chamber, and a cooling chamber, wherein a temperature in the buffer chamber is greater than 20° C., a temperature in the high temperature chamber is within a range from 25° C. to 150° C., and a temperature in the cooling chamber is lower than the temperature in the high temperature chamber and is greater than a room temperature, wherein the high temperature testing module is disposed in the high temperature chamber, and the high temperature testing module is configured to be in contact with the chips carried by the chip tray kit, so that the chips are tested in a high temperature state, wherein one of the movable doors is disposed between any two of the chambers, and the inflating device is configured to fill each of the chambers with a clean super dry air, and wherein, when any one of the movable doors is open, the inflating device fills the corresponding chamber with the super dry air.

7. The chip testing system according to claim 1, further comprising a converting apparatus, wherein the converting apparatus is configured to convert the chip tray kit having the auxiliary insertion members fixed thereto between a horizontal state and a vertical state.

8. The chip testing system according to claim 1, wherein each of a plurality of accommodating recesses is in spatial communication with the corresponding one of the chip accommodating slots and the corresponding one of the fixing thru-holes, each of the chip fixing members has at least one limiting structure formed in the corresponding one of the chip accommodating slots, and the at least one limiting structure is configured to limit a movement range of the chip in the accommodating slot relative to the chip fixing member, wherein each of the auxiliary insertion members further includes a main body and a plurality of protrusions, the protrusions protrude from a side of the main body, and each of the insertion thru-holes penetrates through the main body and the corresponding one of the protrusions, wherein, when each of the auxiliary insertion members is fixed to the side of the chip fixing members, each of the protrusions is correspondingly arranged in the accommodating recess, wherein an outer diameter of each of the protrusions is less than a diameter of each of the accommodating recesses, the outer diameter of each of the protrusions is greater than a diameter of each of the chip accommodating slots, and a diameter of each of the insertion thru-holes is less than the diameter of each of the chip accommodating slots, and wherein a gap is formed between each of the protrusions and the chip disposed in the chip accommodating slot.

9. The chip testing system according to claim 1, wherein each of the pressing assemblies includes:
a base seat configured to be fixed to the at least one lid;
a pressing member having a contacting portion, wherein the contacting portion includes a contacting surface, a portion of the contacting portion is configured to extend into the at least one of the fixing thru-holes, and the contacting surface is configured to press a surface of the chip disposed in the corresponding one of the chip accommodating slots; and
at least one elastic member having two ends respectively fixed to the base seat and the pressing member, wherein, when the pressing member presses the surface of the chip, the at least one elastic member is elastically deformed, and when the pressing member no longer presses the surface of the chip, an elastic returning force generated by the at least one elastic member being pressed allows the pressing member to return to a state where the pressing member does not press the chip.

10. The chip testing system according to claim 9, wherein, when the at least one lid covers the side of the tray, the at least one lid, the tray, the chip fixing members, the auxiliary insertion members, and the chips jointly define an enclosed space, and wherein the chip testing apparatus further includes at least one air suction device configured to suction away air in the enclosed space, so that the enclosed space is in a negative pressure state.

11. The chip testing system according to claim 9, wherein the at least one lid includes a main body and a conduction structure, the temperature adjusting device is connected to the conduction structure, the temperature adjusting device is configured to allow a temperature of the conduction structure to increase or decrease, each of the base seats is detachably fixed to the conduction structure, and the conduction structure and the pressing members are configured to mutually transfer heat through the base seats and the elastic members, so that the temperature of each of the pressing members reaches the predetermined temperature.

12. The chip testing system according to claim 9, wherein each of the pressing assemblies further includes a heat conduction member, at least one limiting member is disposed on the base seat, the heat conduction member is connected to the pressing member, the heat conduction member is connected to the base seat, the heat conduction member is arranged between the pressing member and the base seat, and the heat conduction member is configured to facilitate transfer of heat between the pressing member and the base seat.

13. The chip testing system according to claim 9, wherein each of the pressing members further includes an abutting portion, each of the pressing assemblies further includes at least one fixing structure and at least one limiting member, the at least one fixing structure is fixed to the base seat, the at least one limiting member is detachably fixed with the at least one fixing structure, a portion of the at least one limiting member is configured to abut against the abutting portion of the pressing member, and the at least one limiting member and the at least one fixing member are configured to jointly limit a movement range of the pressing member relative to the base seat, and wherein the at least one limiting member includes an accommodating notch configured to accommodate a portion of the contacting portion.

14. The chip testing system according to claim 1, wherein the chip tray kit further includes a plurality of auxiliary fixing members and a plurality of elastic members, each of the auxiliary fixing members is detachably fixed to the tray, the auxiliary fixing members are disposed at an outer periphery of each of the tray thru-holes, and the auxiliary fixing members are configured to limit a movement range of the chip fixing members in the tray thru-holes relative to the tray, and wherein the elastic members are disposed between each of the chip fixing members and a plurality of side walls forming the corresponding one of the tray thru-holes.

15. The chip testing system according to claim 1, wherein the chip tray kit further includes a plurality of quick release members, and each of the auxiliary insertion members is configured to be detachably connected to the corresponding one of the chip fixing members through at least one of the quick release members.

16. The chip testing system according to claim 15, wherein each of the chip fixing members includes at least one recess, the at least one recess is configured to allow one of the quick release members to be disposed therein, the quick release member disposed in the at least one recess includes two limiting members and two elastic members, an end of each of the elastic members is fixed to a side wall forming the at least one recess, another end of each of the elastic members is fixed to one of the limiting members, and a gap is formed between the two limiting members, wherein at least two engaging members are disposed at a side of each of the auxiliary insertion members, and wherein the at least two engaging members of each of the auxiliary insertion members are configured to be engaged with the two limiting members of the corresponding one of the chip fixing members.

17. The chip testing system according to claim 16, wherein each of the auxiliary insertion members includes at least one thru-hole, and when each of the auxiliary insertion members is fixedly disposed on the side of the corresponding one of the chip fixing members, the at least one thru-hole is in spatial communication with the corresponding one of the gaps, and wherein each of the gaps is configured to be passed through by an insertion member of the insertion member detaching apparatus, and the insertion member passing through the corresponding one of the thru-holes of the auxiliary insertion member is configured to push the two limiting members, so that the two limiting members are not engaged with the two engaging members.

18. The chip testing system according to claim 17, wherein each of the limiting members includes an engaging slot, each of the limiting members is separated into a pushing portion and an engaging portion by the engaging slot, the engaging portion includes an engaging inclined surface, and each of the engaging members includes an engaging inclined surface, and wherein, when the engaging inclined surface of each of the engaging members is in contact with the engaging inclined surface of the corresponding one of the limiting members, a movement range of each of the engaging members relative to the limiting member is limited.

* * * * *